(12) United States Patent
Chen

(10) Patent No.: US 11,177,202 B2
(45) Date of Patent: Nov. 16, 2021

(54) MULTILAYER STRUCTURE AND METHOD FOR FABRICATING THE SAME

(71) Applicant: MACRONIX INTERNATIONAL CO., LTD., Hsinchu (TW)

(72) Inventor: Shih-Hung Chen, Hsinchu County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 155 days.

(21) Appl. No.: 16/680,636

(22) Filed: Nov. 12, 2019

(65) Prior Publication Data
US 2021/0143090 A1 May 13, 2021

(51) Int. Cl.
*H01L 23/498* (2006.01)
*H01L 23/522* (2006.01)
*H01L 23/538* (2006.01)

(52) U.S. Cl.
CPC .. *H01L 23/49822* (2013.01); *H01L 23/49827* (2013.01); *H01L 23/49838* (2013.01)

(58) Field of Classification Search
CPC ......... H01L 23/49822; H01L 23/49838; H01L 23/49827; H01L 23/522; H01L 23/5383; H01L 27/11582; H01L 21/76805; H01L 21/76877
See application file for complete search history.

(56) References Cited

U.S. PATENT DOCUMENTS 8,383,512 B2 2/2013 Chen
8,541,882 B2 9/2013 Chen
8,598,032 B2 12/2013 Chen
8,633,099 B1 1/2014 Shih
8,836,137 B2 9/2014 Chen
(Continued)

FOREIGN PATENT DOCUMENTS

CN 103904083 A 7/2014
TW 201606928 A 2/2016

OTHER PUBLICATIONS

TW Office Action dated Jul. 24, 2020 in Taiwan application (No. 108141007).

*Primary Examiner* — Marcos D. Pizarro
*Assistant Examiner* — Antonio B Crite
(74) *Attorney, Agent, or Firm* — McClure, Qualey & Rodack, LLP

(57) ABSTRACT

A multilayer structure includes a substrate and a plurality of sub-stacks extending along a first direction respectively and disposed on an upper surface of the substrate along a second direction. Each of the sub-stacks includes insulating layers and patterned sacrificial layers alternately stacked on the upper surface along a third direction; conductive layers alternately stacked on the upper surface with the insulating layers along the third direction; and interlayer connectors extending along the third direction; wherein the patterned sacrificial layers have first sides and second sides opposite to the first sides, the conductive layers include first side conductive layers corresponding to the first sides and second side conductive layers corresponding to the second sides; wherein the interlayer connectors are electrically connected and directly contact corresponding ones of the conductive layers, and the first direction, the second direction, and the third direction are crossed.

20 Claims, 38 Drawing Sheets

(56) References Cited

U.S. PATENT DOCUMENTS

| | | |
|---|---|---|
| 8,970,047 B2 | 3/2015 | Chen |
| 2013/0075802 A1* | 3/2013 | Chen ................ H01L 27/11556 |
| | | 257/314 |
| 2014/0053979 A1 | 2/2014 | Chen |
| 2015/0162344 A1 | 6/2015 | Lee et al. |

* cited by examiner

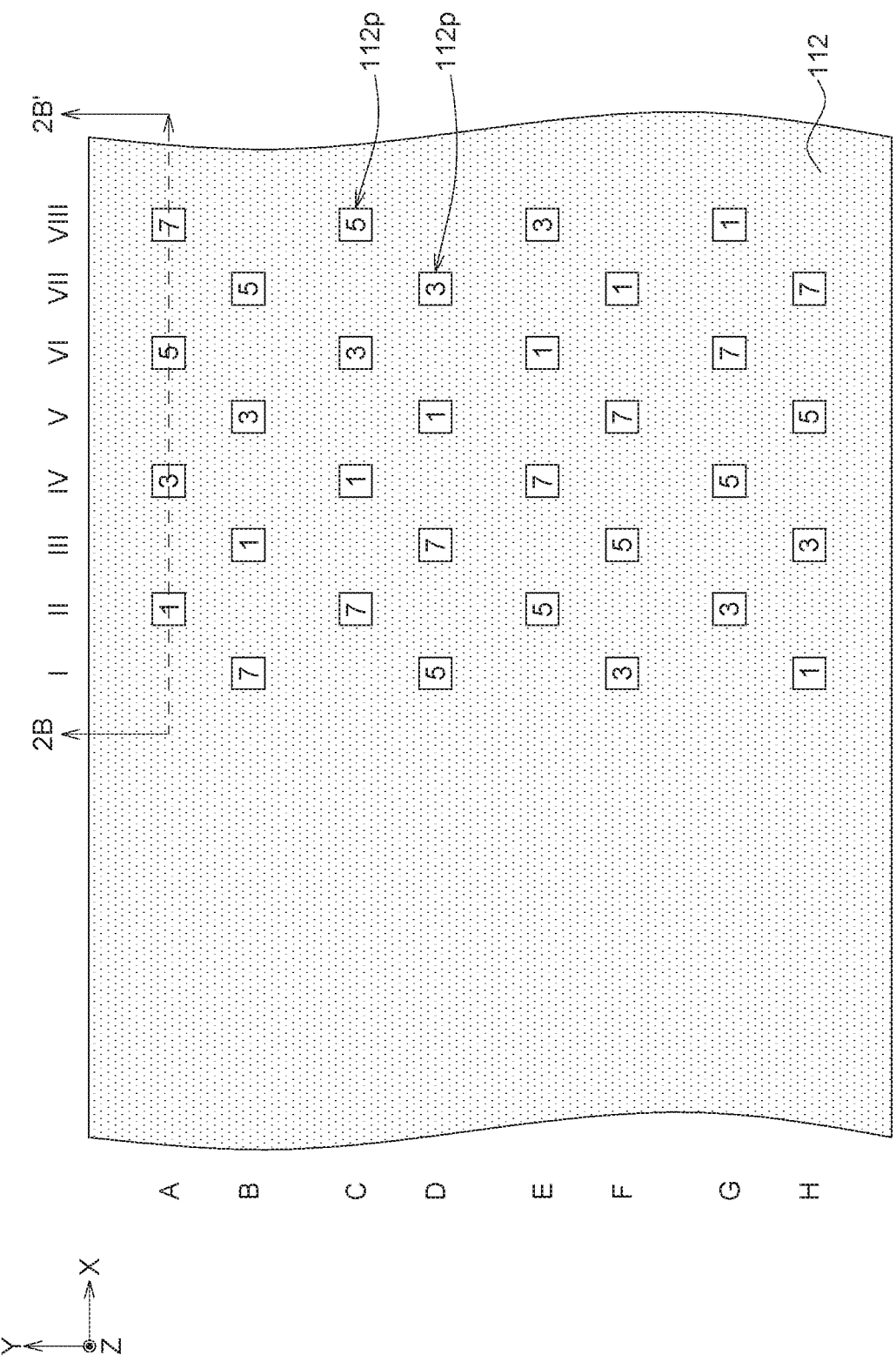

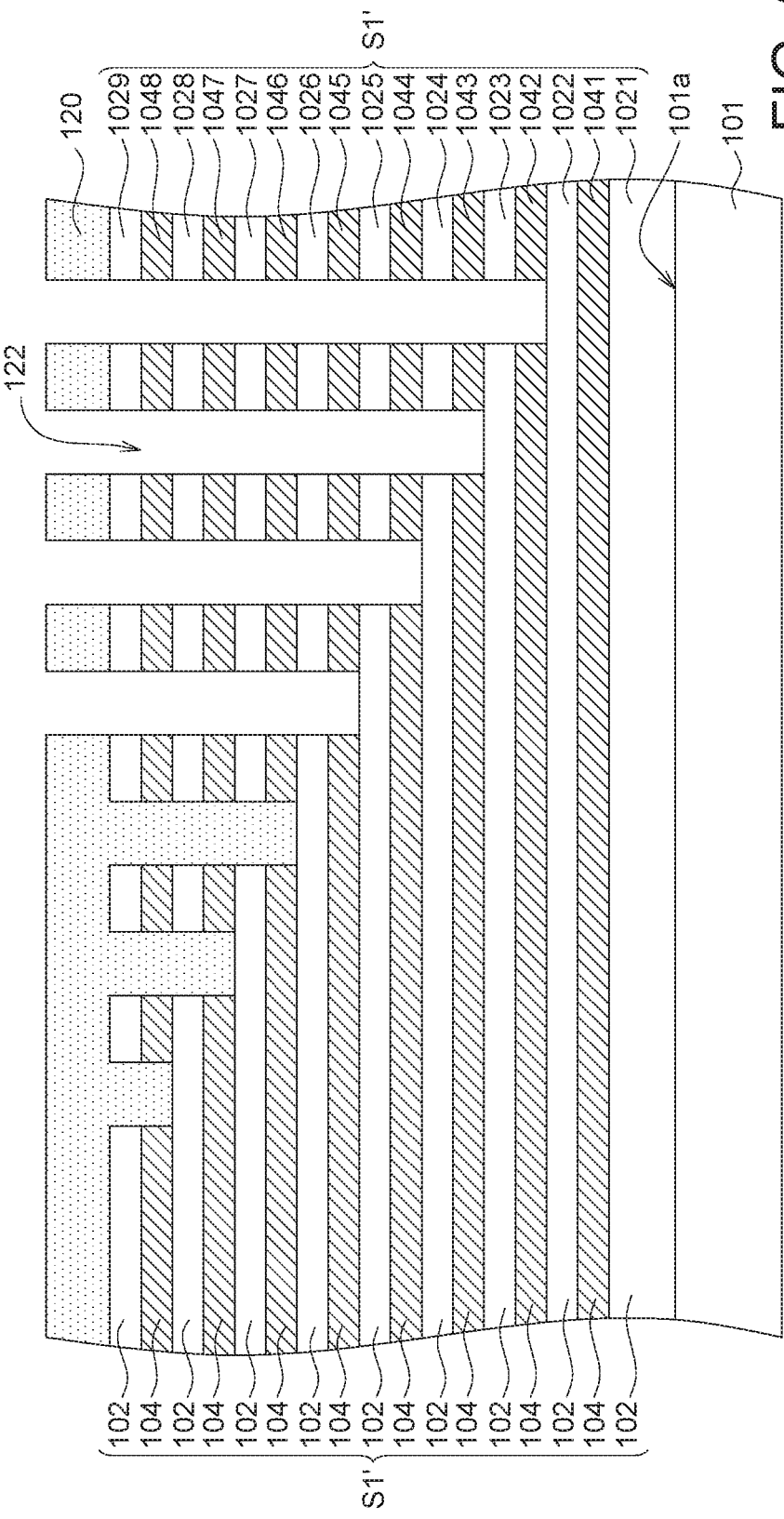

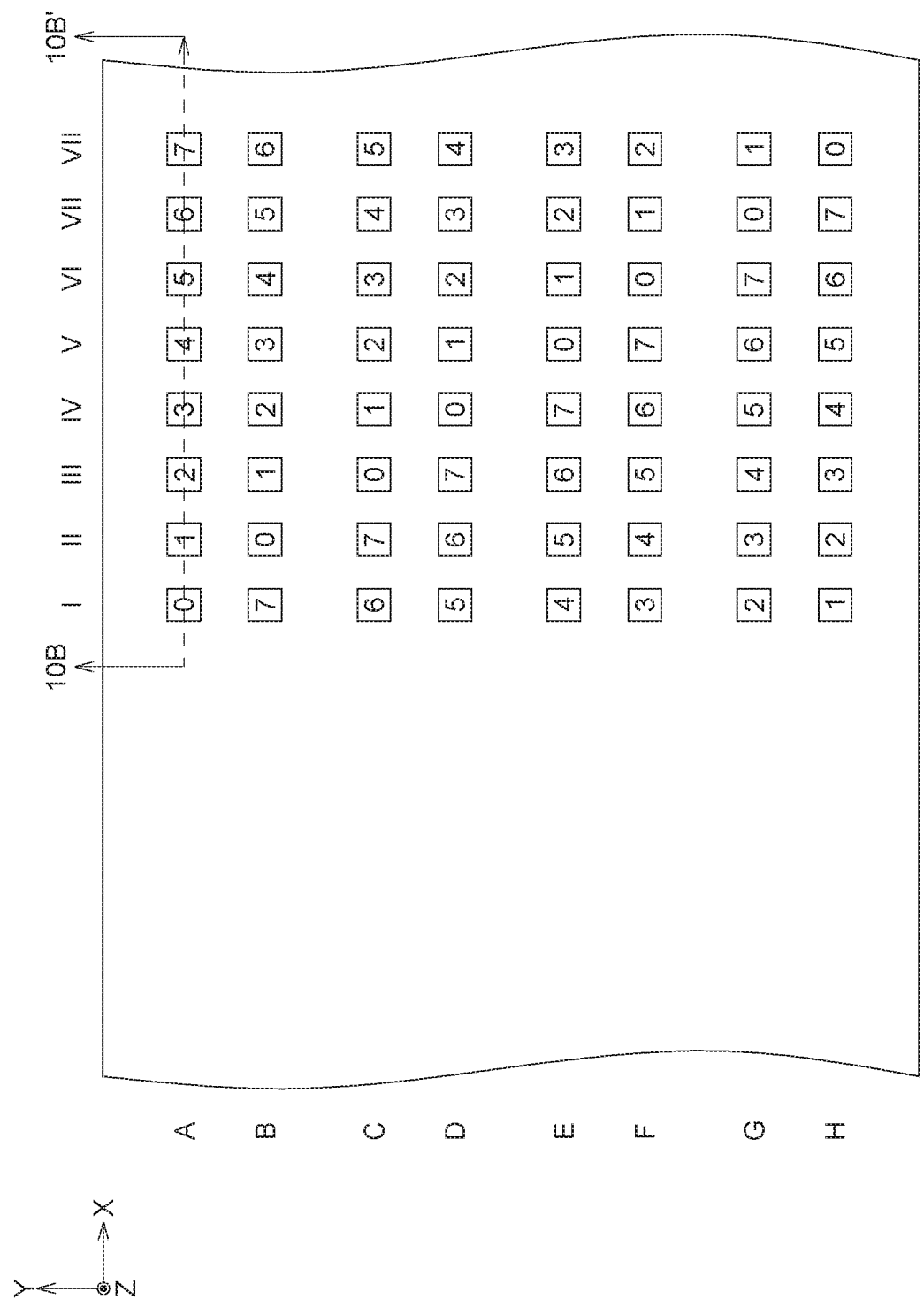

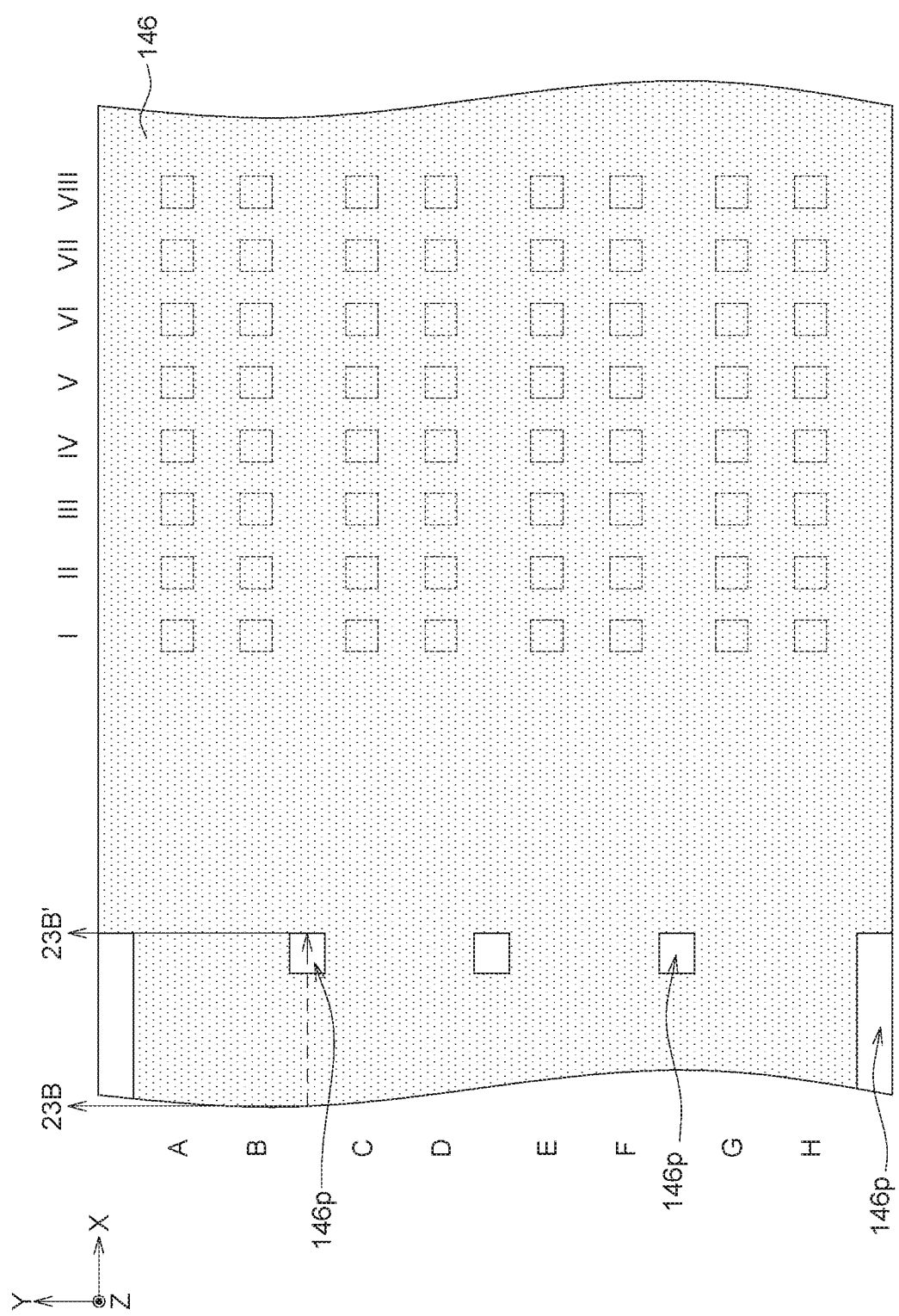

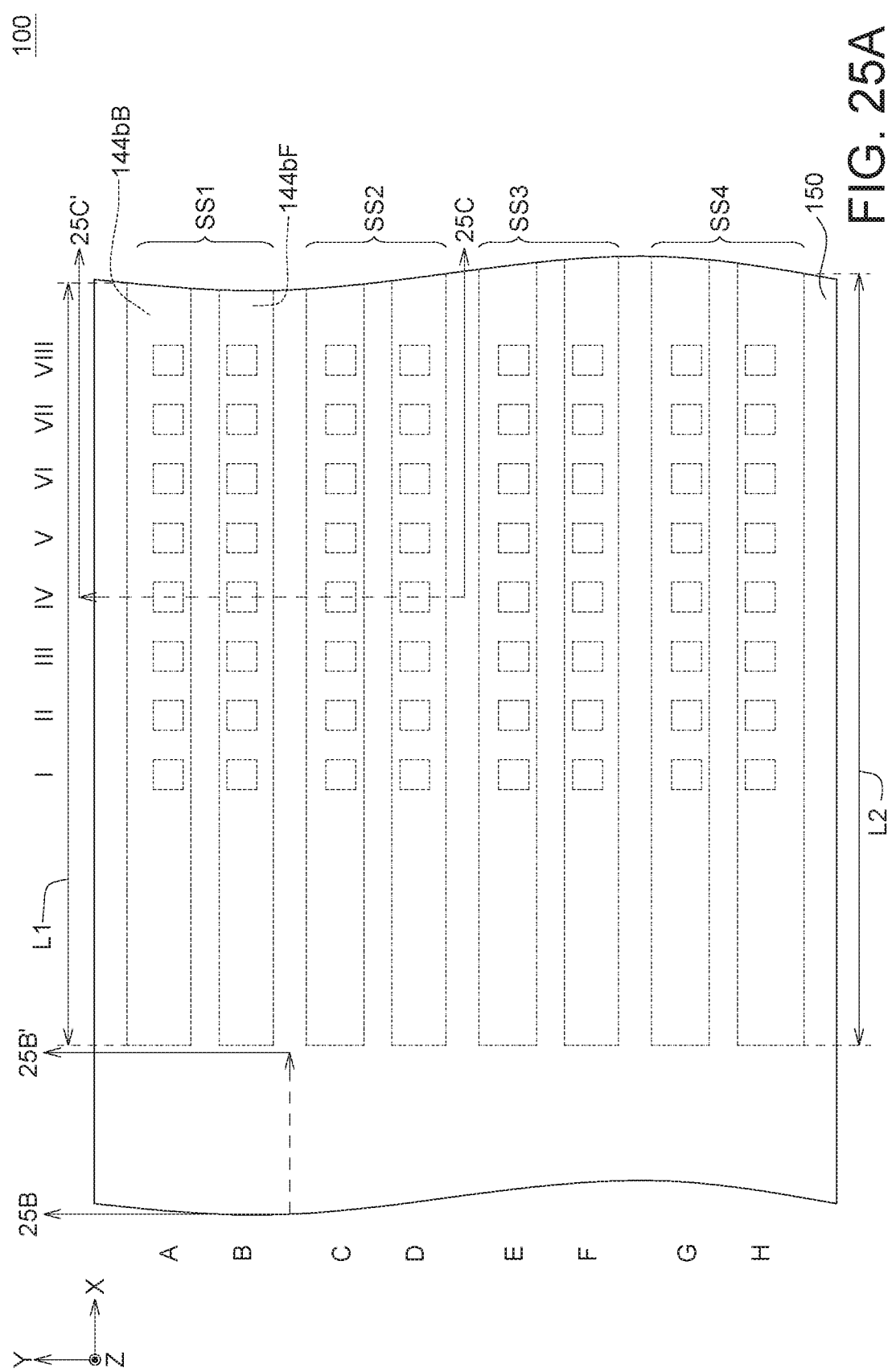

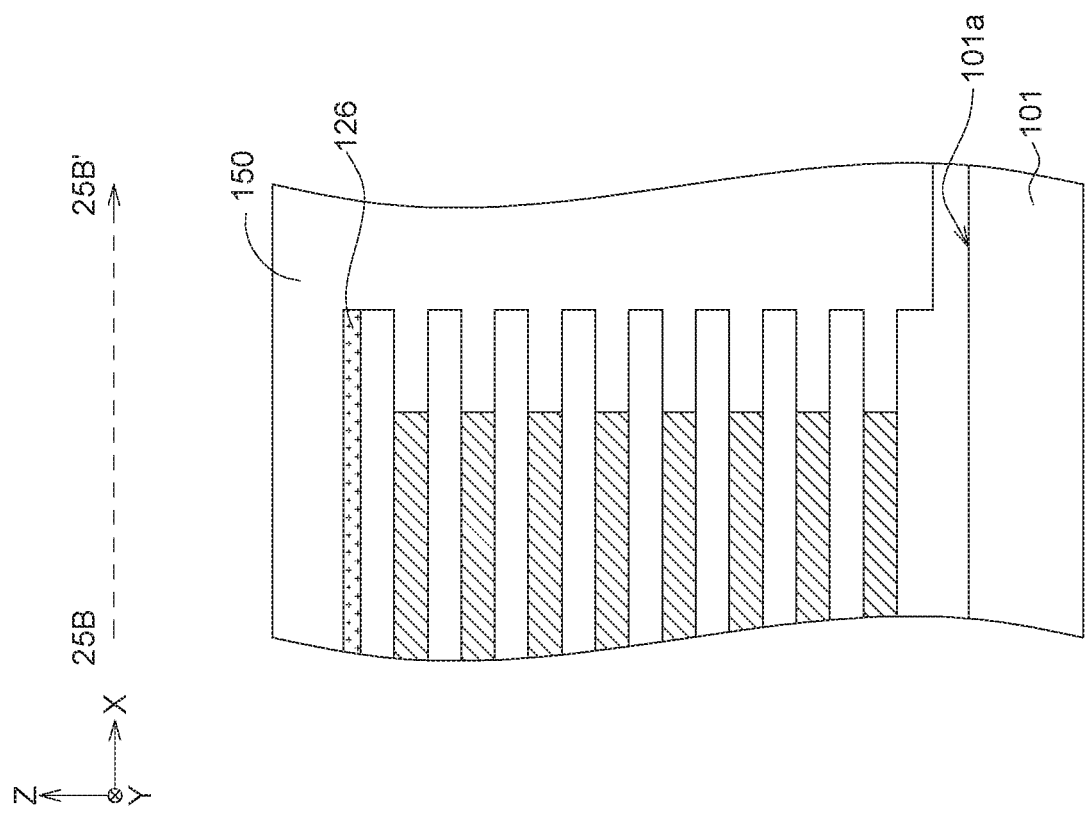

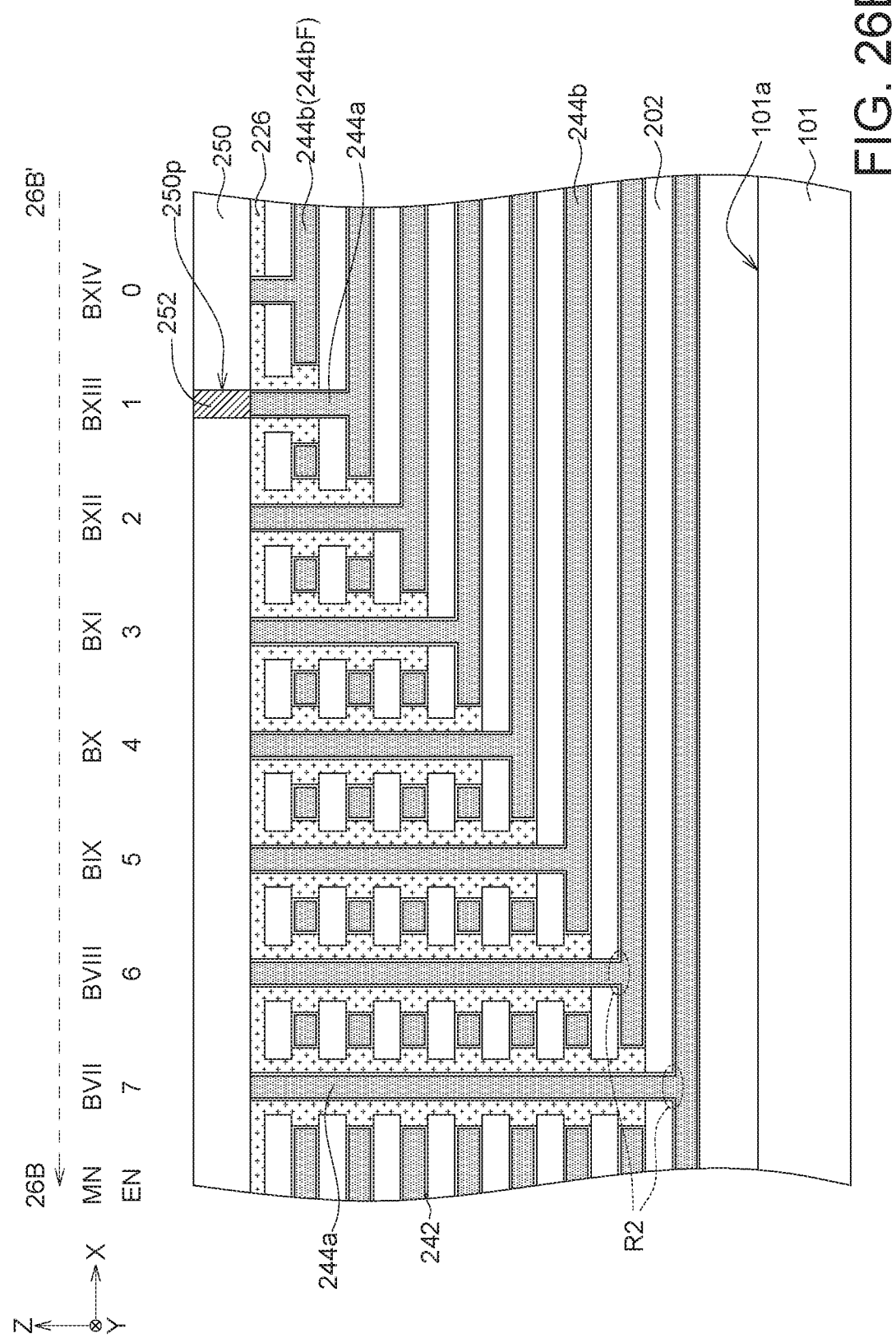

MULTILAYER STRUCTURE AND METHOD FOR FABRICATING THE SAME

BACKGROUND OF THE INVENTION

Field of the Invention

The invention relates in general to a multilayer structure and a method for fabricating the same, and more particularly to a multilayer structure used for a semiconductor device and a method for fabricating the same.

Description of the Related Art

The elements in a semiconductor device or between different semiconductor devices are generally electrically connected through interlayer connectors in a multilayer structure. In general, the multilayer structure includes a plurality of conductive layers and a plurality of insulating layers alternately stacked on a substrate, and the interlayer connectors formed of the conductive material extend in a vertical direction and are electrically connected to the specific conductive layer. However, as the demand for the number of layers of the multilayer structure increases, the amount of conductive material required increases, and the process is more complicated, which may greatly increase the cost for fabricating.

Therefore, there is a need to propose an advanced multilayer structure and a method for fabricating the same to solve the problems faced by the prior art.

SUMMARY OF THE INVENTION

The invention is directed to a multilayer structure and method for fabricating the same. Since a plurality of conductive layers and a plurality of interlayer connectors can be formed by the same conductor process, the process method of the present invention can decrease the complexity of the process and reduce the costs.

According to an aspect of the present invention, a multilayer structure is provided. The multilayer structure includes a substrate and a plurality of sub-stacks extending along a first direction respectively and disposed on an upper surface of the substrate along a second direction. Each of the sub-stacks includes insulating layers and patterned sacrificial layers alternately stacked on the upper surface along a third direction; conductive layers alternately stacked on the upper surface with the insulating layers along the third direction; and interlayer connectors extending along the third direction; wherein the patterned sacrificial layers have first sides and second sides opposite to the first sides, the conductive layers include first side conductive layers corresponding to the first sides and second side conductive layers corresponding to the second sides; wherein the interlayer connectors are electrically connected and directly contact corresponding ones of the conductive layers, and the first direction, the second direction, and the third direction are crossed.

According to an aspect of the present invention, a method for fabricating a multilayer structure is provided. The method includes the following steps. Firstly, a substrate having an upper surface is provided. Then, a laminated body is formed on the upper surface of the substrate, wherein the laminated body comprises a plurality of insulating layers and a plurality of sacrificial layers alternately stacked on the upper surface. Next, a plurality of vertical openings penetrating through portions of the insulating layers and the sacrificial layers are formed. A plurality of trenches penetrating through the stacked body and exposing a lowermost insulating layer of the insulating layers are formed. Portions of the sacrificial layers are removed, and a plurality of lateral openings are formed at positions where the sacrificial layers are removed, wherein remaining ones of the sacrificial layers form a plurality of patterned sacrificial layers. Thereafter, a conductive material is filled in the vertical openings and the lateral openings to form a plurality of interlayer connectors in the vertical openings, and to form a plurality of conductive layers in the lateral openings, wherein the interlayer connectors, the conductive layers, the patterned sacrificial layers and the insulating layers constitute a plurality of sub-stacks, wherein the sub-stacks respectively extend along a first direction and are disposed along the second direction on the upper surface of the substrate, the interlayer connectors extend along a third direction, wherein the first direction, the second direction, and the third direction are crossed. The patterned sacrificial layers have a plurality of first sides and a plurality of second sides opposite to the first sides, the conductive layers including a plurality of first side conductive layers corresponding to the first sides and a plurality of second side conductive layers corresponding to the second sides. The interlayer connectors are electrically connected and directly contact corresponding ones of the conductive layers.

The above and other aspects of the invention will become better understood with regard to the following detailed description of the preferred but non-limiting embodiment(s). The following description is made with reference to the accompanying drawings.

BRIEF DESCRIPTION OF THE DRAWINGS

FIG. 2A is a top view showing a method for fabricating the multilayer structure subsequent to FIG. 1A.

FIG. 9 is a cross-sectional view showing a method for fabricating the multilayer structure subsequent to FIG. 8.

FIG. 10A is a top view showing a method for fabricating the multilayer structure 100 subsequent to FIG. 9.

FIG. 23A is a top view of a method for fabricating the multilayer structure subsequent to FIG. 22A.

FIG. 25A is a top view showing a method for fabricating the multilayer structure subsequent to FIG. 24.

FIG. 25B is a cross-sectional view showing a method for fabricating the multilayer structure subsequent to FIG. 24.

FIG. 26B is a cross-sectional view of taken along line 26B-26B' of FIG. 26A.

DETAILED DESCRIPTION OF THE INVENTION

FIGS. 1A-25C are top views and cross-sectional views showing a method for fabricating a multilayer structure 100 in accordance with an embodiment of the present disclosure.

Figure 1A:
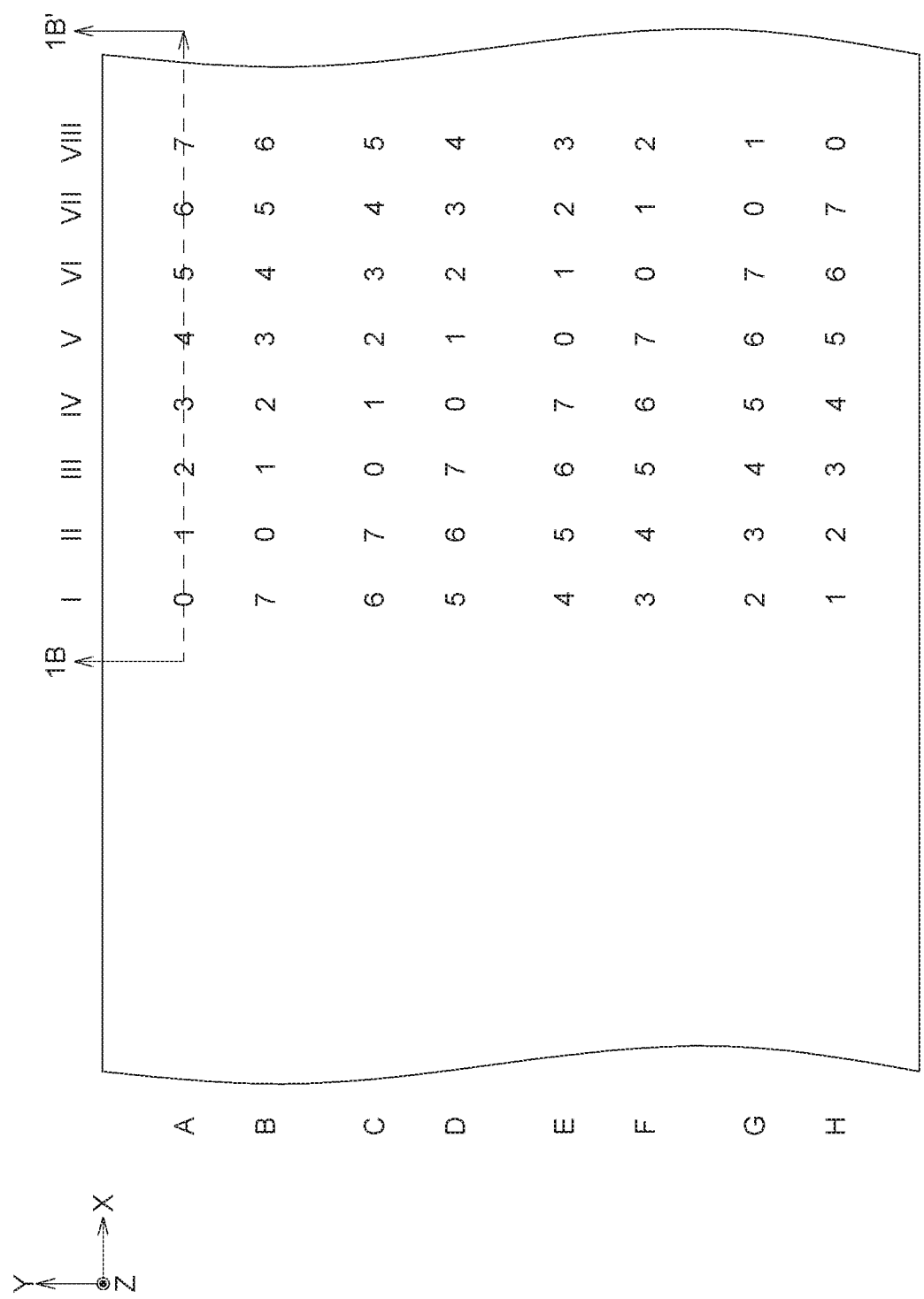
FIG. 1A is a top view of a method for fabricating a multilayer structure in accordance with an embodiment of the present disclosure.
Figure 1B:
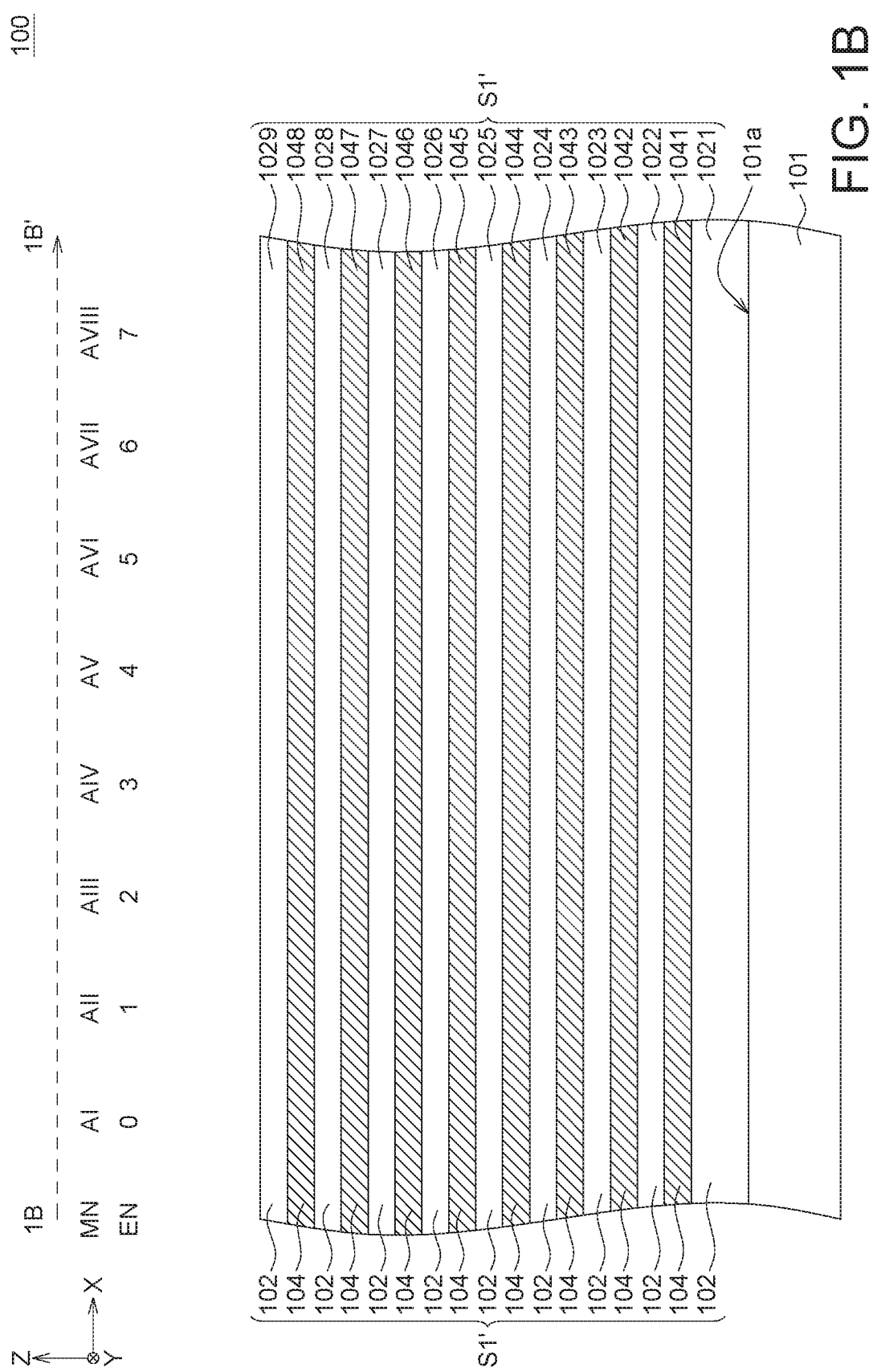
FIG. 1B is a cross-sectional view taken along line 1B-1B' of FIG. 1A.

FIG. 1A is a top view of a method for fabricating a multilayer structure 100 in accordance with an embodiment of the present disclosure. FIG. 1B is a cross-sectional view taken along line 1B-1B' of FIG. 1A.

Referring to FIGS. 1A and 1B simultaneously, a substrate 101 is provided, and a laminated body S1' is formed on an upper surface 101a of the substrate 101. The laminated body S1' includes a plurality of insulating layers 102 and a plurality of sacrificial layers 104 alternately stacked on the upper surface 101a of the substrate 101, for example, by a deposition process. In this embodiment, the insulating layer 102 has 9 layers, including the insulating layer 1021~1029 from the bottom to the top layers, the sacrificial layer 104 has 8 layers, including the sacrificial layer 1041~1048 from the bottom to the top layers. However, the present invention does not limited thereto. In other embodiments, the number of layers of the insulating layers 102 and the sacrificial layers 104 may be adjusted as needed. In the present embodiment, the bottommost insulating layer 1021 has a thickness larger than that of the other insulating layers 1022 to 1029, but the invention is not limited thereto.

In some embodiments, the substrate 101 can be a silicon substrate or other suitable substrate, and the substrate 101 can be electrically connected to a complementary metal oxide semiconductor (CMOS) (not shown) or other suitable components. The insulating layers 102 may be formed of an oxide such as silicon dioxide ($SiO_2$). The sacrificial layers 104 may be formed of a nitride such as silicon nitride (SiN).

In FIG. 1A, the numbers 0 to 7 annotated in the laminated body S1' indicate the amount of pairs of the insulating layers 102 and the sacrificial layers 104 penetrated by third initial vias 122 (shown in FIG. 10B) of the subsequent process. Similarly, the amount of the insulating layers 102 and the sacrificial layers 104 penetrated by a third initial via 122 (shown in FIG. 10B) is indicated in FIG. 1B by the etching pairs EN from 0 to 7. The third initial vias 122 (shown in FIG. 10B) extend, for example, along a normal direction of the upper surface 101a of the substrate 101. In the present embodiment, the predetermined positions of the third initial vias 122 (shown in FIG. 10B) form an array arranged in rows A to H and columns I to VIII. For example, the predetermined position of the third initial via 122 (shown in FIG. 10B) at row A and column II is denoted by 1, and it indicates that the third initial via 122 at row A and column II penetrates through a pair of insulating layer 102 and sacrificial layer 104, that is, penetrates through the uppermost insulating layer 1029 and sacrificial layer 1048. The predetermined position of the third initial via 122 (shown in FIG. 10B) at row A and column IV is denoted by 3, and it indicates that the third initial via 122 (shown in FIG. 10B) at row A and column IV penetrates through three pairs of the insulating layers 102 and the sacrificial layers 104, that is, it penetrates through the insulating layers 1029, 1028, 1027 and sacrificial layers 1048, 1047, 1046. However, the present invention is not limited thereto. In other embodiments, the number of pairs of the insulating layer 102 and the sacrificial layer 104 through which the initial via penetrates may be different according to design requirements.

Figure 10B:
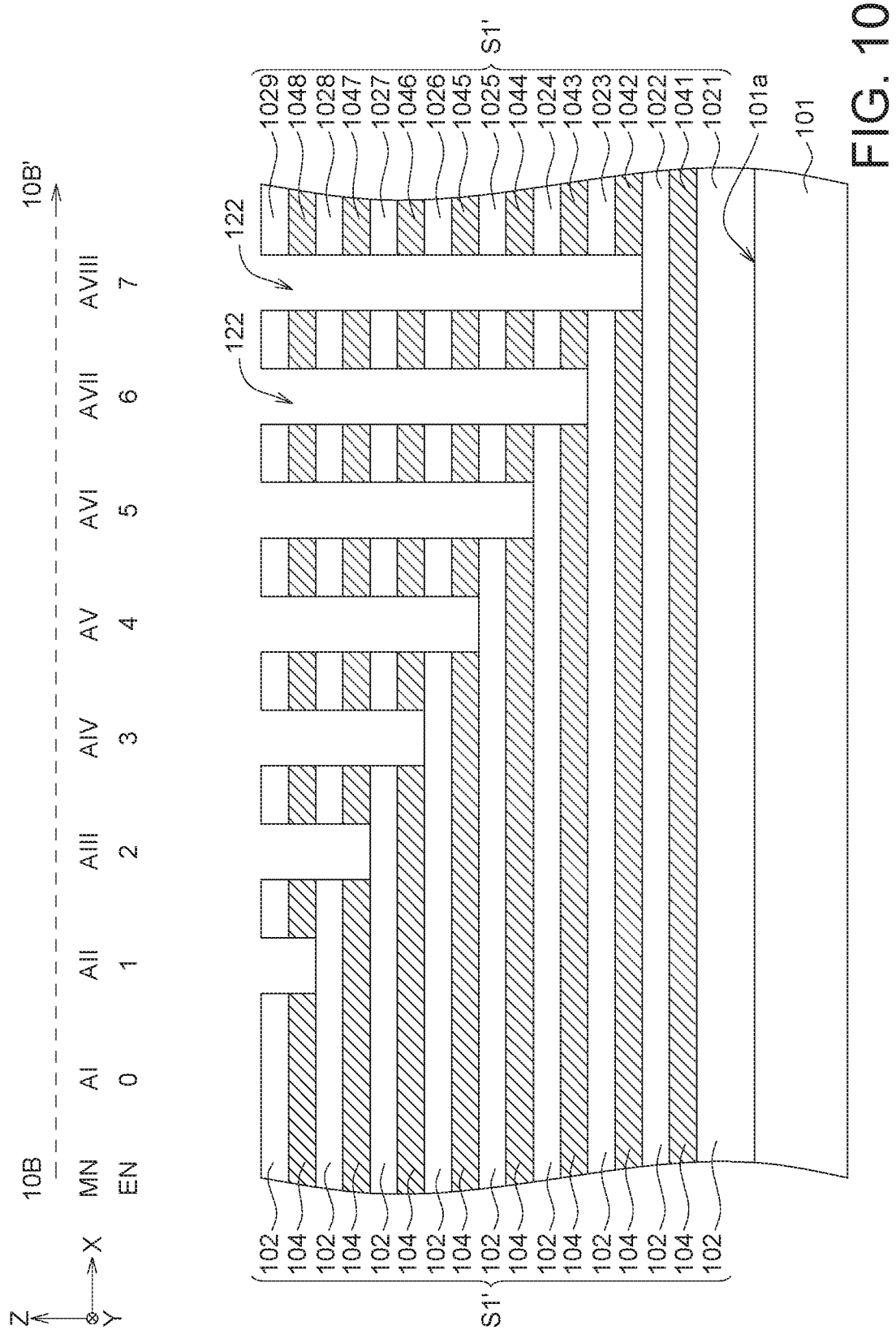
FIG. 10B is a cross-sectional view showing a method for fabricating the multilayer structure subsequent to FIG. 9.

In FIG. 1B, the coordinates MN indicate predetermined positions AI~AVIII of the third initial vias 122 (shown in FIG. 10B). For example, when the coordinate MN is AIII, it indicates a predetermined position corresponding to the third initial via 122 (shown in FIG. 10B) at row A and column III, and the predetermined etching pairs EN is 2, indicating that the third initial via 122 (shown in FIG. 10B) will penetrate through two pairs of insulating layers 102 and the sacrificial layers 104, that is, penetrating through the insulating layers 1029, 1028, 1027, 1026 and the sacrificial layers 1048, 1047, 1046, 1045. For example, when the coordinate MN is AV, it indicates a predetermined position corresponding to the third initial via 122 (shown in FIG. 10B) at row A and column V, and the predetermined etching pairs EN is 2, indicating the third initial via 122 (shown in FIG. 10B) will penetrate through two pairs of the insulating layers 102 and the sacrificial layers 104, that is, penetrating through the insulating layers 1029, 1028 and the sacrificial layers 1048, 1047.

Figure 2B:
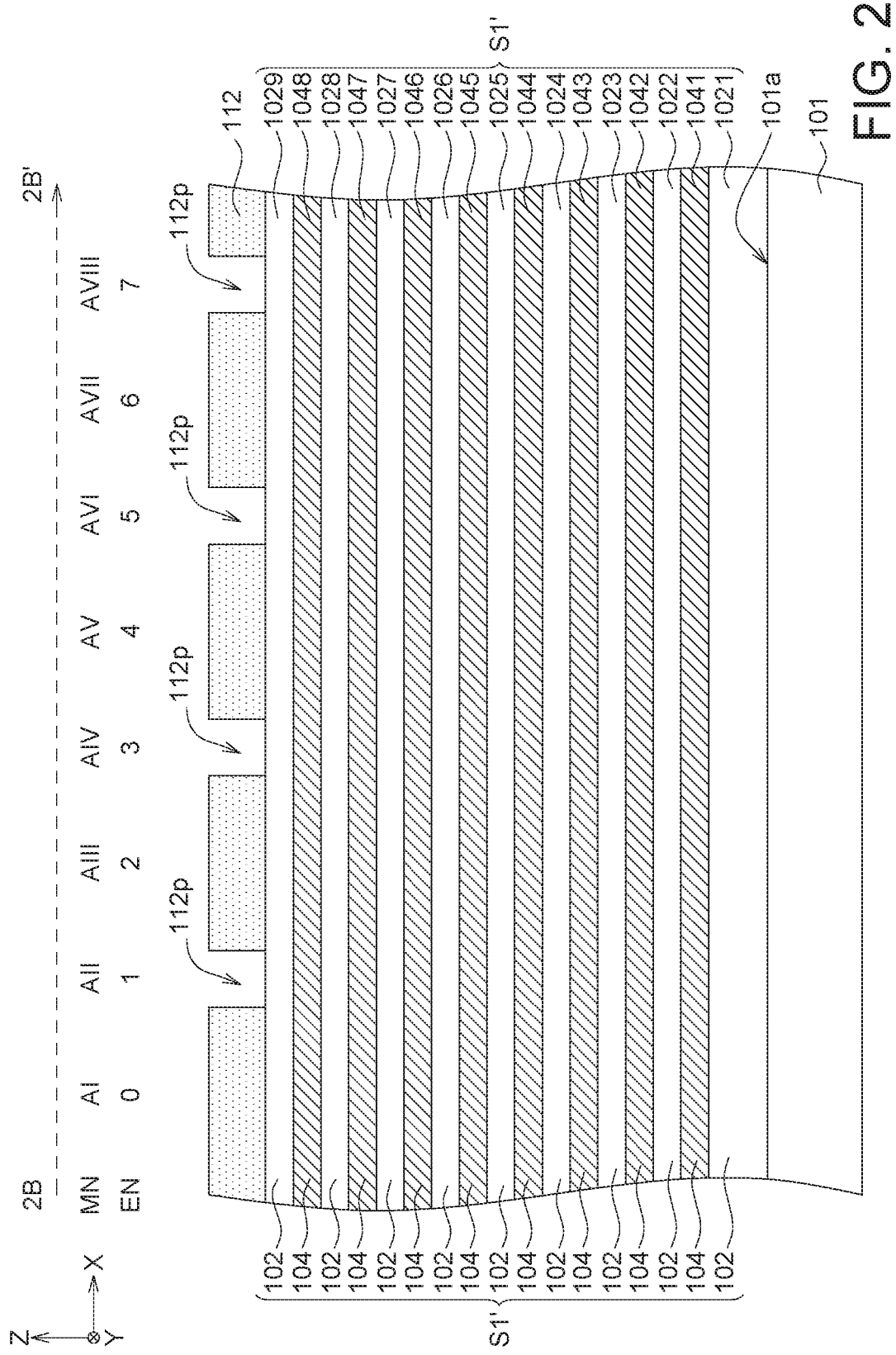
FIG. 2B is a cross-sectional view taken along line 2B-2B' of FIG. 2A.

FIG. 2A is a top view showing a method for fabricating the multilayer structure 100 subsequent to FIG. 1A. FIG. 2B is a cross-sectional view taken along line 2B-2B' of FIG. 2A.

Referring to FIGS. 2A and 2B simultaneously, a first initial mask 112 is formed on the laminated body S1', and a plurality of first initial mask openings 112p are formed penetrating through the first initial mask 112. In FIG. 2B, the first initial mask openings 112p correspond to the positions where the coordinates MN are AII, AIV, AVI, and AVIII. The first initial mask 112 is formed, for example, of a photoresist material.

Figure 3:
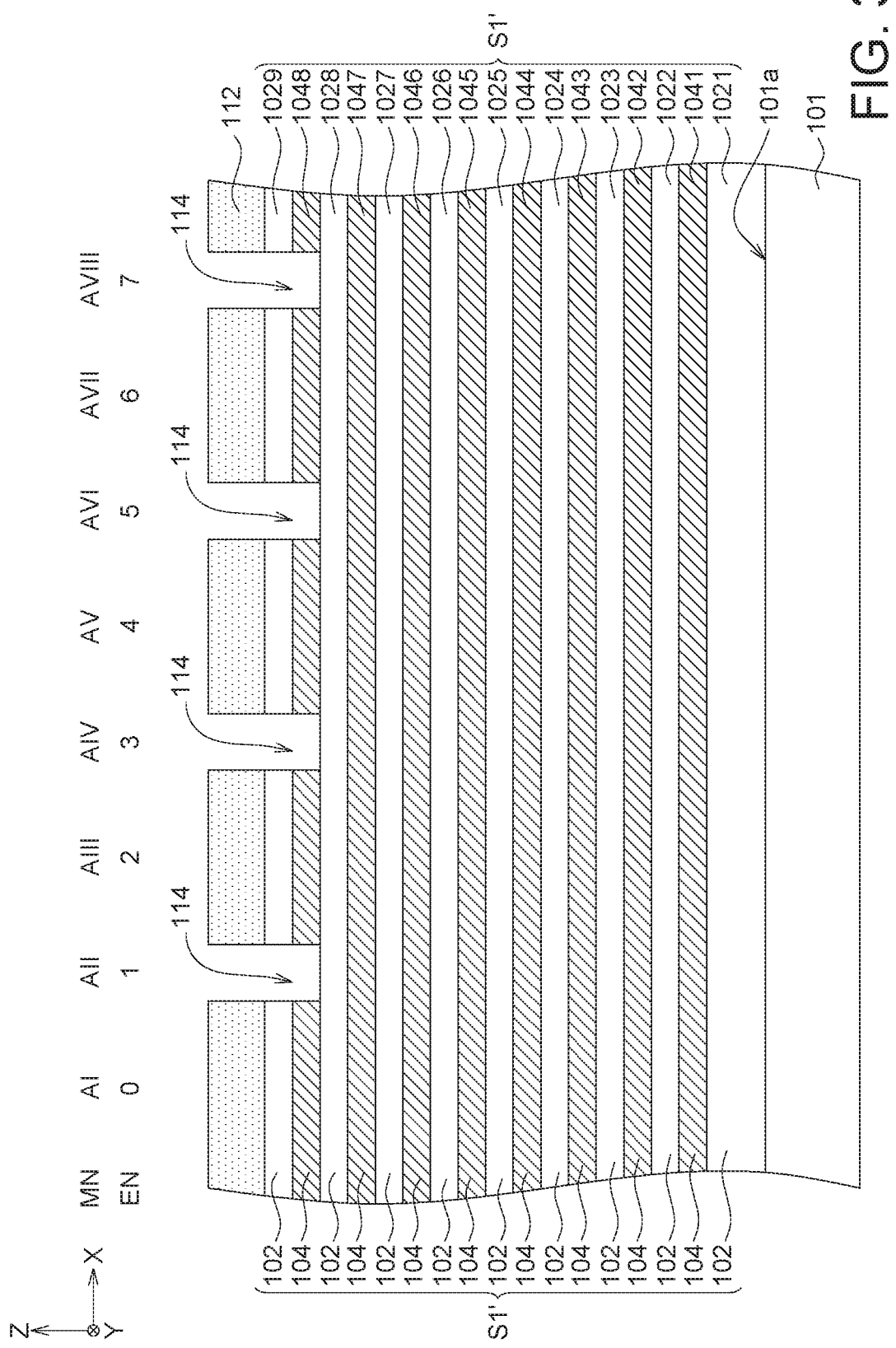
FIG. 3 is a cross-sectional view showing a method for fabricating the multilayer structure subsequent to FIG. 2B.

FIG. 3 is a cross-sectional view showing a method for fabricating the multilayer structure 100 subsequent to FIG. 2B.

Referring to FIG. 3, a pair ($2^0$ pair) of insulating layers 102 and sacrificial layers 104 are removed through the first initial mask openings 112p by an etching process to form a plurality of first initial vias 114 exposing the insulating layer 1028. In some embodiments, each pair of insulating layers 102 and sacrificial layers 104 will have a consistent etching time for the etching process.

Figure 4:
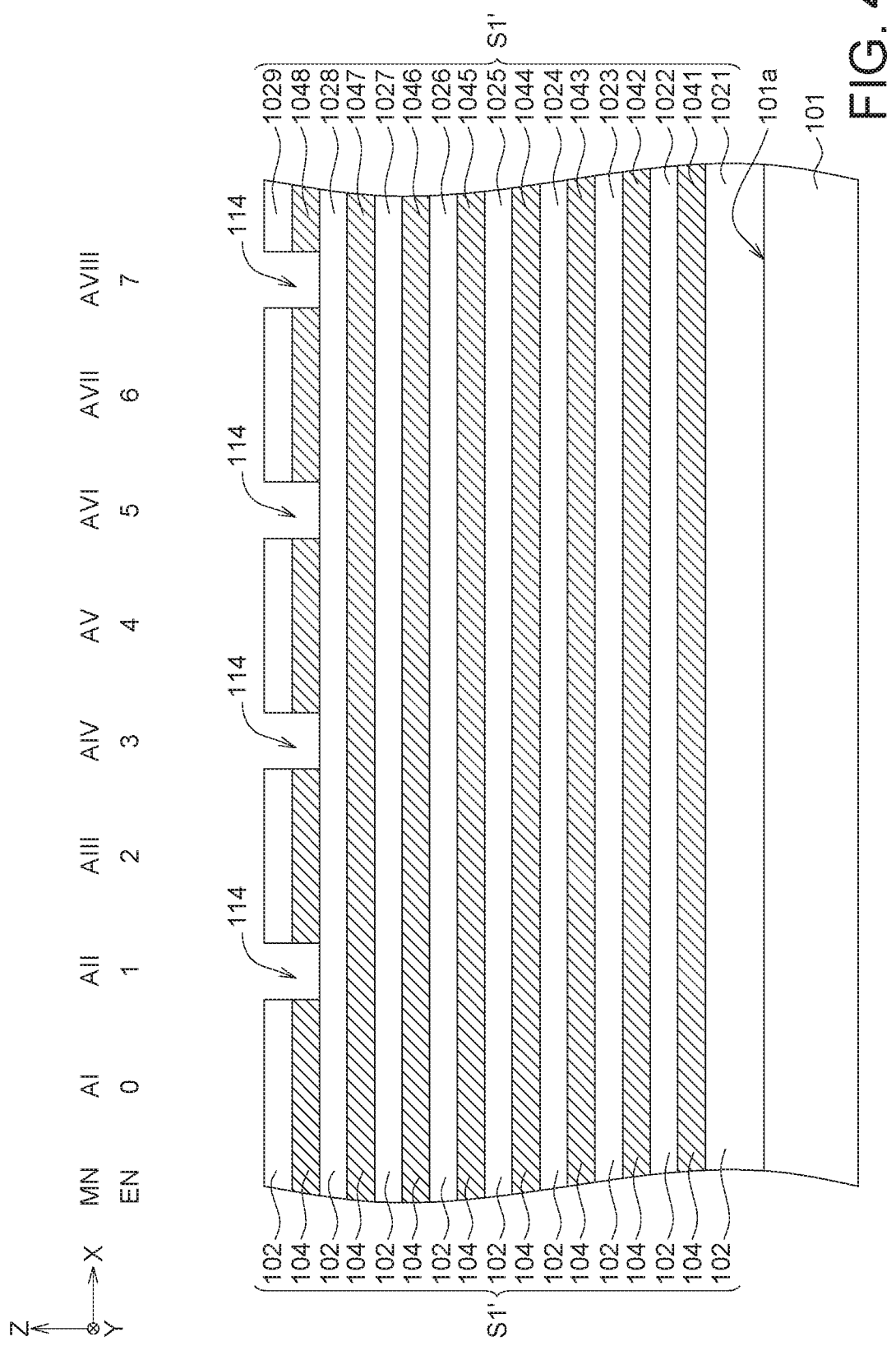
FIG. 4 is a cross-sectional view showing a method for fabricating the multilayer structure subsequent to FIG. 3.

FIG. 4 is a cross-sectional view showing a method for fabricating the multilayer structure 100 subsequent to FIG. 3.

Referring to FIG. 4, the first initial mask 112 is removed.

Figure 5:
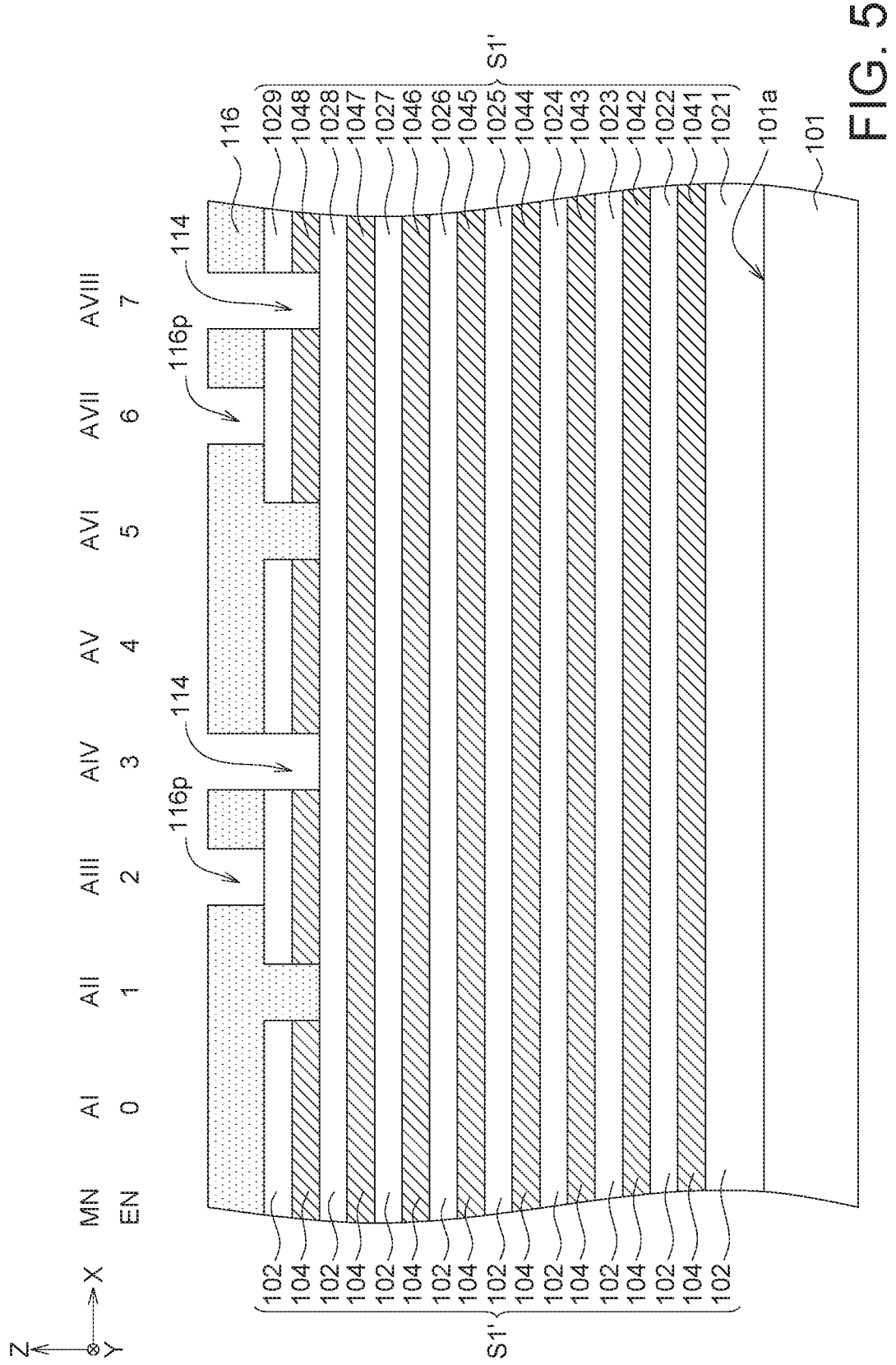
FIG. 5 is a cross-sectional view showing a method of fabricating the multilayer structure subsequent to FIG. 4.

FIG. 5 is a cross-sectional view showing a method of fabricating the multilayer structure 100 subsequent to FIG. 4.

Referring to FIG. 5, a second initial mask 116 is formed on the laminated body S1', and a plurality of second initial mask openings 116p are formed penetrating through the second initial mask 116. In this embodiment, the second initial mask 116 covers portions of the first initial vias 114 (eg, the positions corresponding to the coordinates MN being AII and AVI), exposing the other portions of the first initial vias 114 (eg, the positions corresponding to the coordinates MN being AIV and AVIII), and portions of the insulating layer 1029 are exposed (for example, positions corresponding to the coordinates MN being AIII and AVII).

Figure 6:
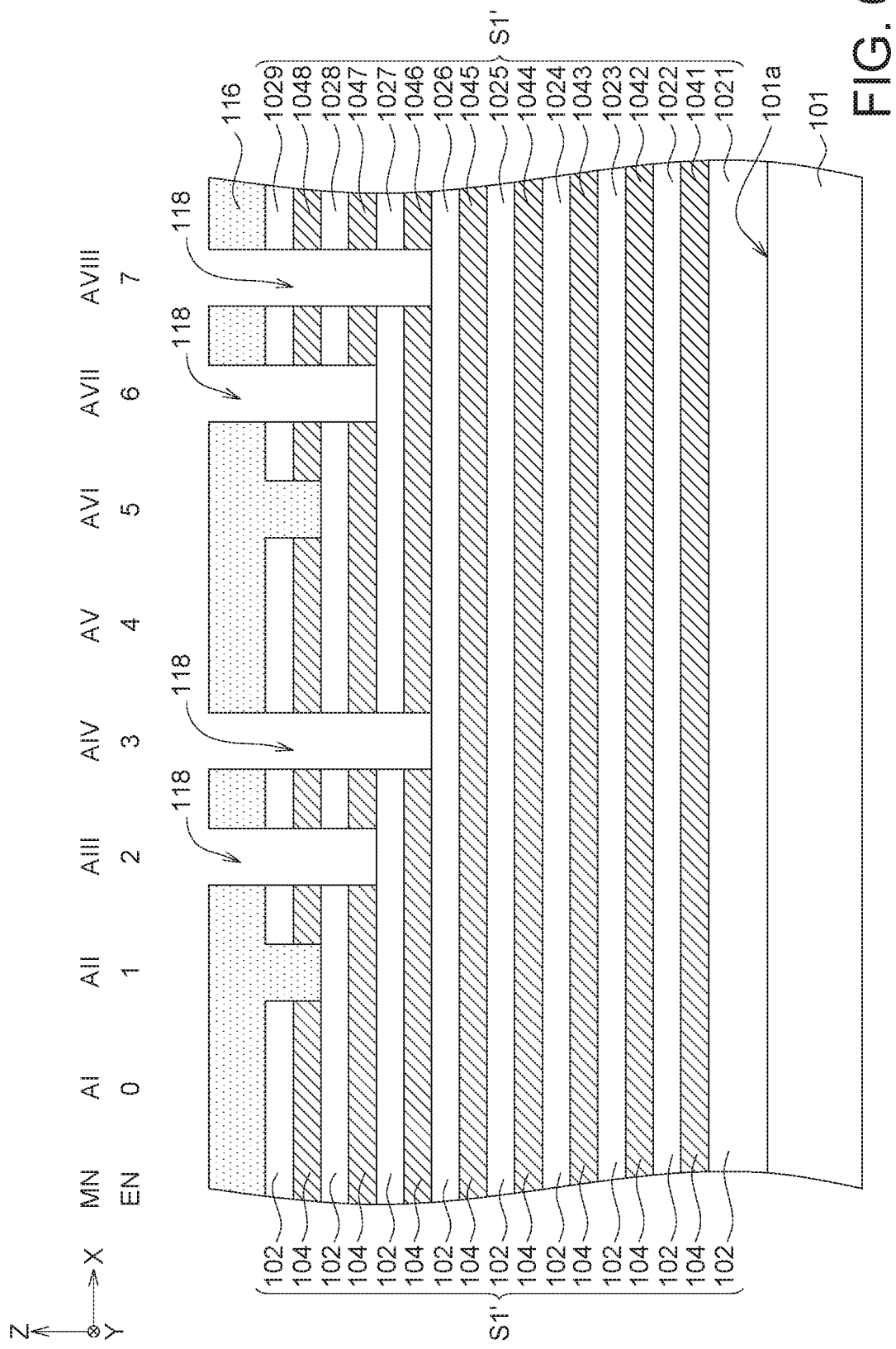
FIG. 6 is a cross-sectional view showing a method for fabricating the multilayer structure subsequent to FIG. 5.

FIG. 6 is a cross-sectional view showing a method for fabricating the multilayer structure 100 subsequent to FIG. 5.

Referring to FIG. 6, two pairs ($2^1$ pairs) of the insulating layers 102 and the sacrificial layers 104 are removed through the second initial mask opening 116p by an etching process to form a plurality of second initial vias 118 exposing insulating layers 1026 or 1027. For example, the second initial vias 118 at positions AIII and AVII expose the insulating layer 1026, and the second initial vias 118 at positions AIV and AVIII expose the insulating layer 1027.

Figure 7:
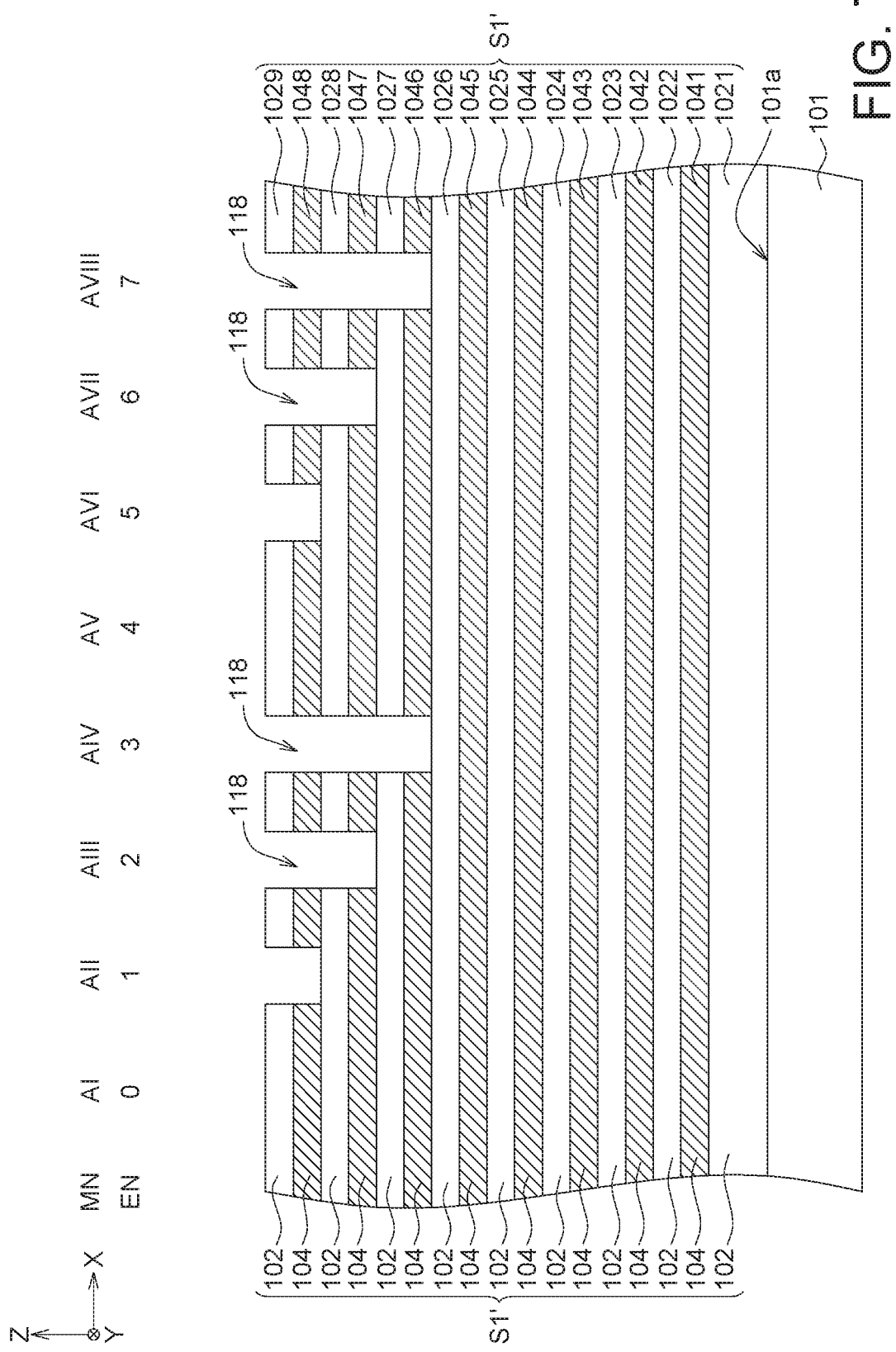
FIG. 7 is a cross-sectional view showing a method for fabricating the multilayer structure subsequent to FIG. 6.

FIG. 7 is a cross-sectional view showing a method for fabricating the multilayer structure 100 subsequent to FIG. 6.

Referring to FIG. 7, the second initial mask 116 is removed to further form second initial vias 118 exposing the insulating layer 1028. For example, the second initial vias 118 at positions AII and AVI exposes the insulating layer 1026.

Figure 8:
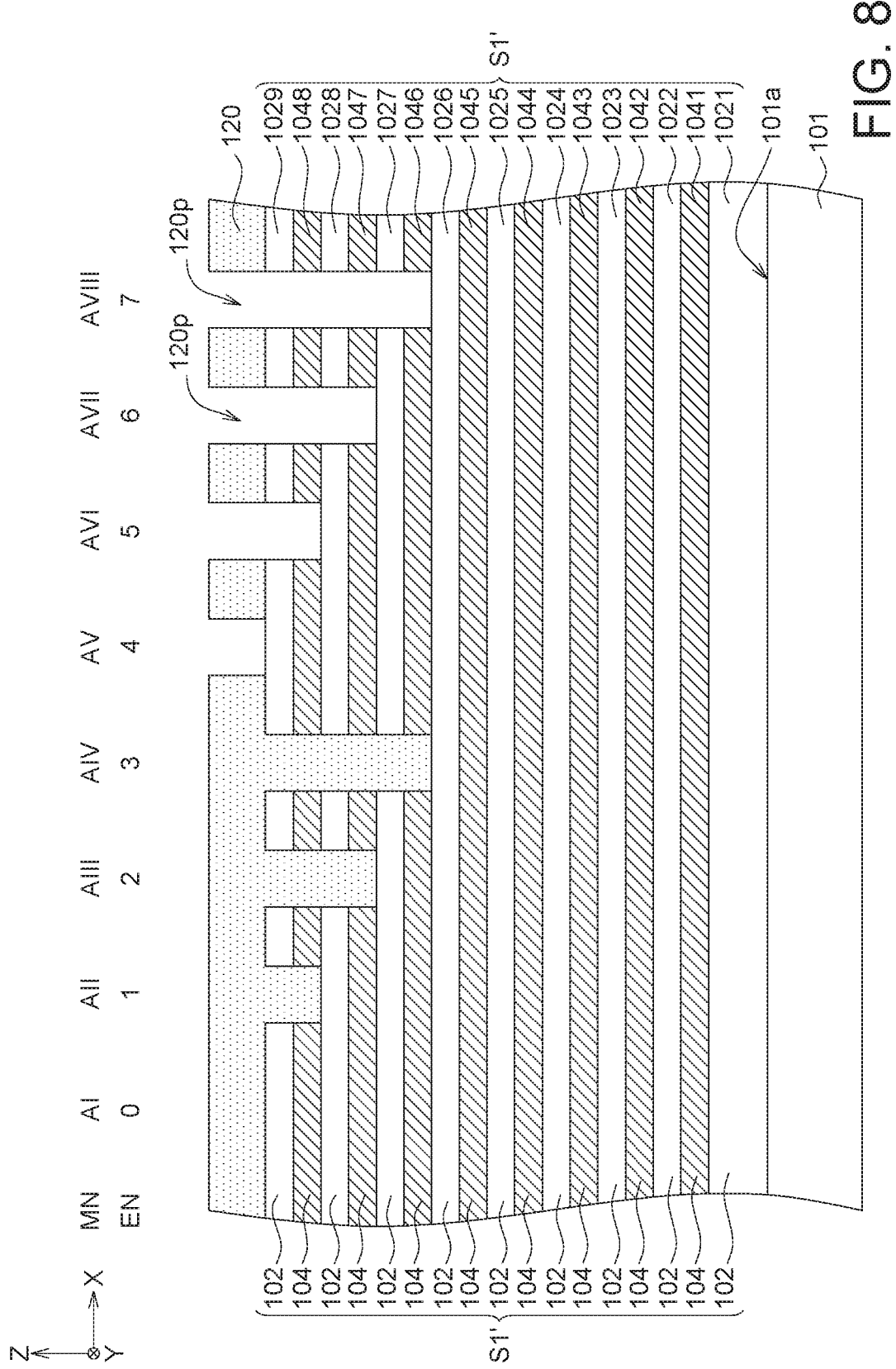
FIG. 8 is a cross-sectional view showing a method for fabricating the multilayer structure subsequent to FIG. 7.

FIG. 8 is a cross-sectional view showing a method for fabricating the multilayer structure 100 subsequent to FIG. 7.

Referring to FIG. 8, a third initial mask 120 is formed on the laminated body S1', and a plurality of third initial mask openings 120p are formed penetrating through the third initial mask 120. In the present embodiment, the third initial mask 120 covers portions of the second initial vias 118 (for example, the positions corresponding to the coordinates MN being AII to AIV), and exposes other portions of the second initial vias 118 (for example, positions corresponding to the coordinate MN being AVI-AVIII), and portions of the insulating layer 1029 are exposed (for example, a position corresponding to the coordinate MN being AV).

FIG. 9 is a cross-sectional view showing a method for fabricating the multilayer structure 100 subsequent to FIG. 8.

Referring to FIG. 9, four pairs ($2^2$ pairs) of the insulating layers 102 and the sacrificial layers 104 are removed through the third initial mask opening 120p by an etching process to form a plurality of third initial vias 122 exposing the insulating layers 1022, 1023, 1024 or 1025. For example, the third initial via 122 at the position AV exposes the insulating layer 1025, the third initial via 118 at the position AVI exposes the insulating layer 1024, and the third initial via 118 at the position AVII exposes the insulating layer 1023, and the third initial via 118 at position AVIII exposes the insulating layer 1022.

FIG. 10A is a top view showing a method for fabricating the multilayer structure 100 subsequent to FIG. 9. FIG. 10B is a cross-sectional view showing a method for fabricating the multilayer structure 100 subsequent to FIG. 9, wherein FIG. 10B is a cross-sectional view taken along line 10B-10B' of FIG. 10A.

Referring to FIGS. 10A and 10B simultaneously, the third initial mask 120 is removed to further form a plurality of third initial vias 122 exposing the insulating layers 1026~1028. For example, the third initial via 122 at position AII exposes the insulating layer 1028, the third initial via 122 at position AIII exposes the insulating layer 1027, and the third initial via 122 at position AIV exposes the insulating layer 1026. The plurality of third initial vias 122 are used for forming interlayer connectors 144a (shown in FIG. 22B) in the subsequent process, and the relative height between the interlayer connectors 144a (shown in FIG. 22B) is initially defined.

Figure 11:
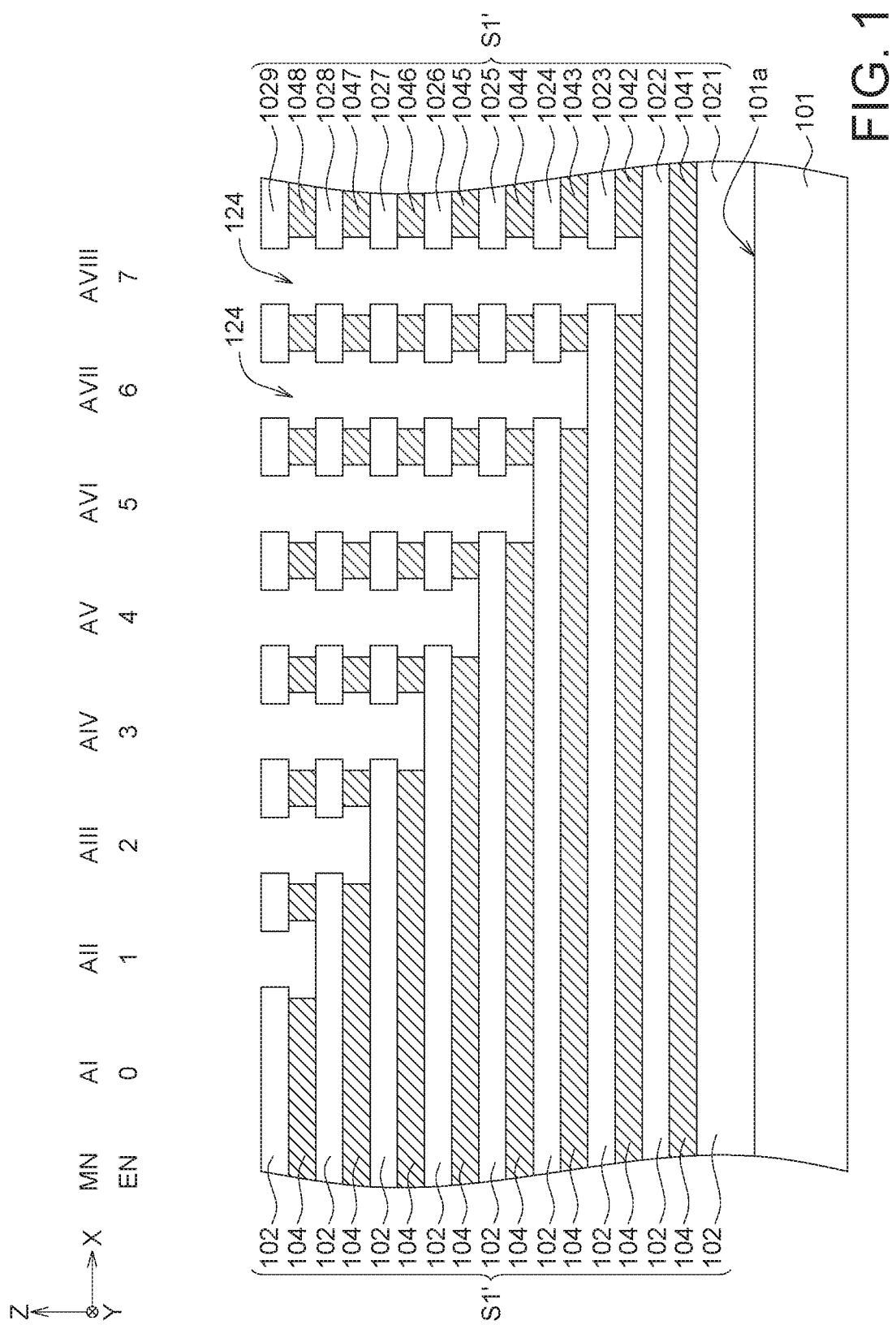
FIG. 11 is a cross-sectional view showing a method for fabricating the multilayer structure subsequent to FIG. 10B.

FIG. 11 is a cross-sectional view showing a method for fabricating the multilayer structure 100 subsequent to FIG. 10B.

Referring to FIG. 11, portions of the sacrificial layers 104 are removed through the third initial vias 122 by an etching back process to form a plurality of etching back openings 124. This etching back process is performed, for example, by hot phosphoric acid ($H_3PO_4$).

Figure 12:
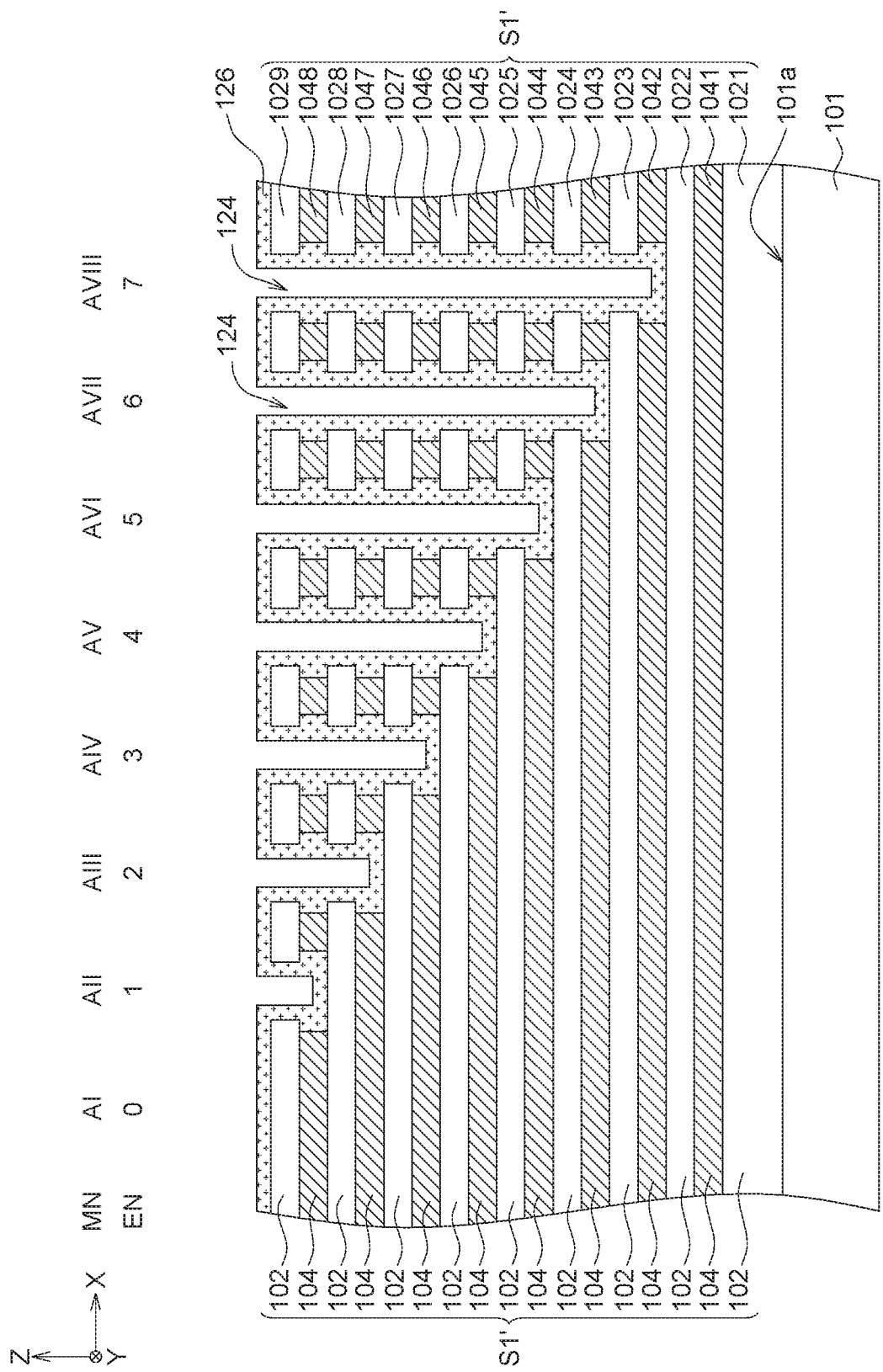
FIG. 12 is a cross-sectional view showing a method of fabricating the multilayer structure subsequent to FIG. 11.

FIG. 12 is a cross-sectional view showing a method of fabricating the multilayer structure 100 subsequent to FIG. 11.

Referring to FIG. 12, a protective layer 126 conformally formed on the etching back opening 124 is formed by a deposition process. This deposition process is, for example, Atomic Layer Deposition (ALD). The protective layer 126 is formed, for example, of a dielectric material such as silicon dioxide ($SiO_2$).

Figure 13:
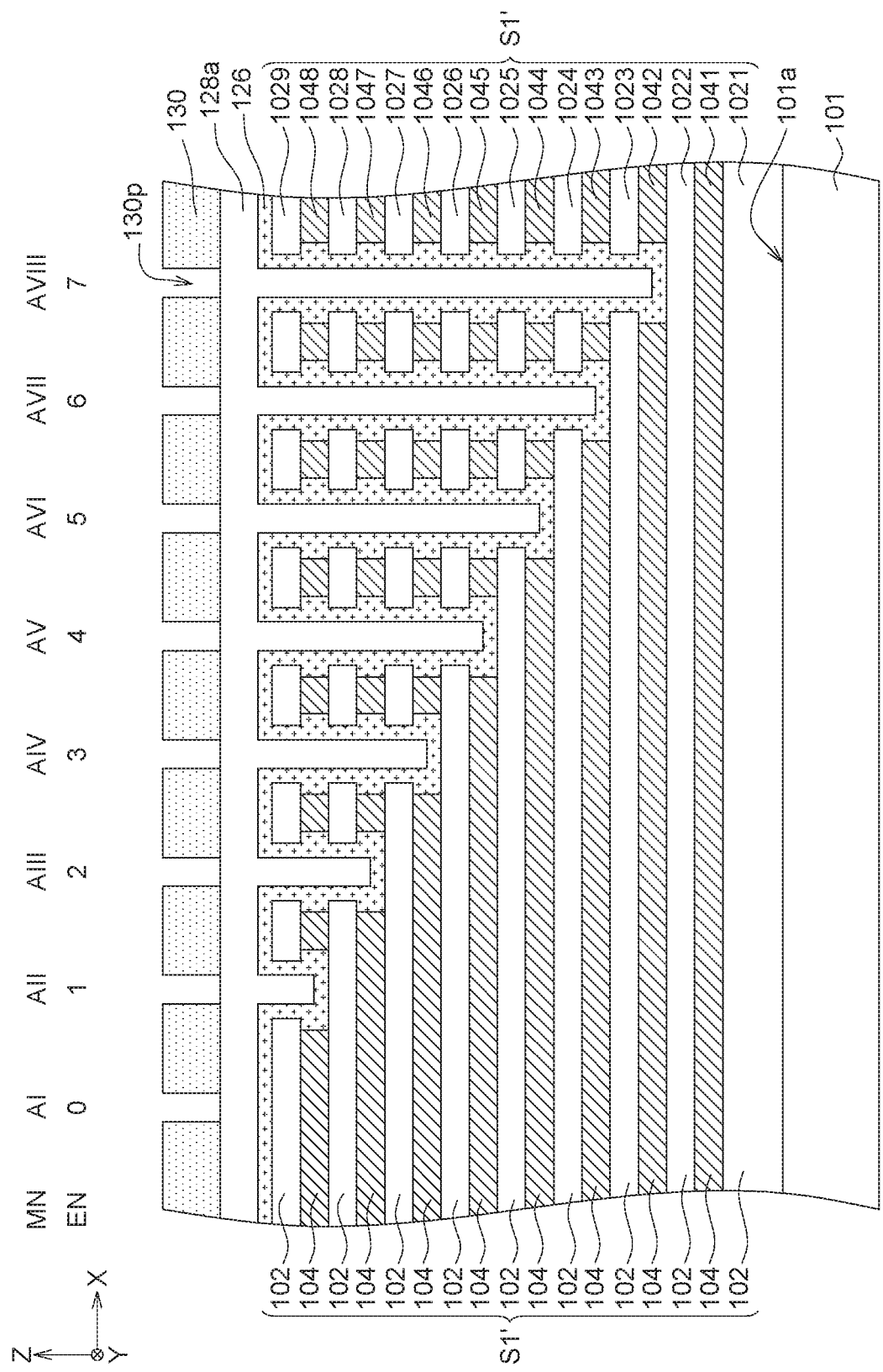
FIG. 13 is a cross-sectional view showing a method for fabricating the multilayer structure subsequent to FIG. 12.

FIG. 13 is a cross-sectional view showing a method for fabricating the multilayer structure 100 subsequent to FIG. 12.

Referring to FIG. 13, a first planarization layer 128a is formed on the protective layer 126 by a deposition process. The first planarization layer 128a is formed, for example, of an organic dielectric material. Next, an etching mask 130 is formed on the first planarization layer 128a, and a plurality of etching mask openings 130p exposing the first planarization layer 128a are formed. The first planarization layer 128a can provide a flat deposition surface for the etching mask 130, and the etching mask 130 can be in direct contact with the first planarization layer 128a. The etching mask openings 130p correspond to the positions for forming the interlayer connectors 144a (shown in FIG. 22B) in the subsequent process. In FIG. 13, the etching mask openings 130p correspond to the positions AI~AVIII.

Figure 14:
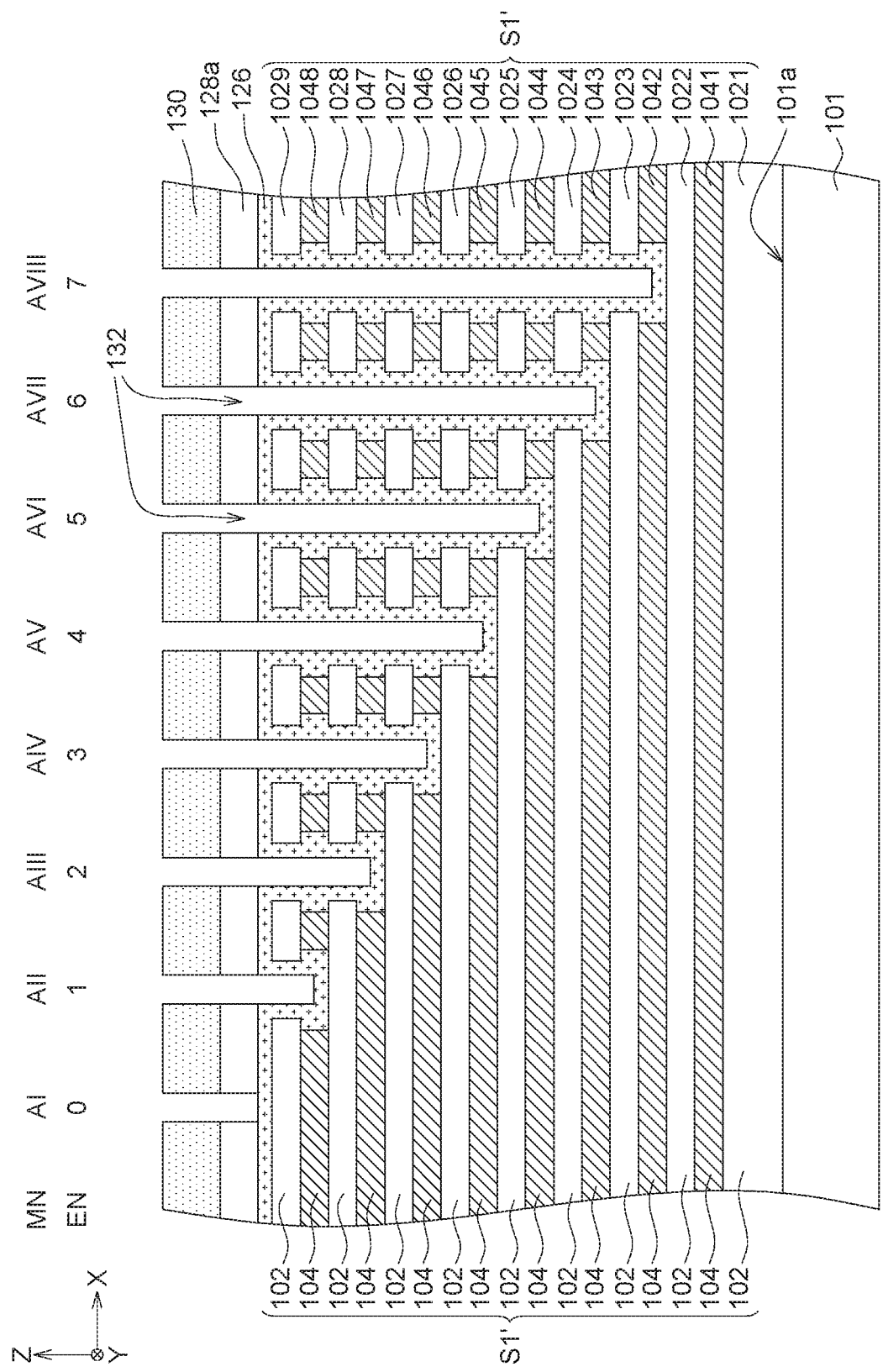
FIG. 14 is a cross-sectional view showing a method for fabricating the multilayer structure subsequent to FIG. 13.

FIG. 14 is a cross-sectional view showing a method for fabricating the multilayer structure 100 subsequent to FIG. 13.

Referring to FIG. 14, portions of the first planarization layer 128a are removed through the etching mask openings 130p by an etching process to form a plurality of the first etching vias 132 exposing the protective layer 126.

Figure 15:
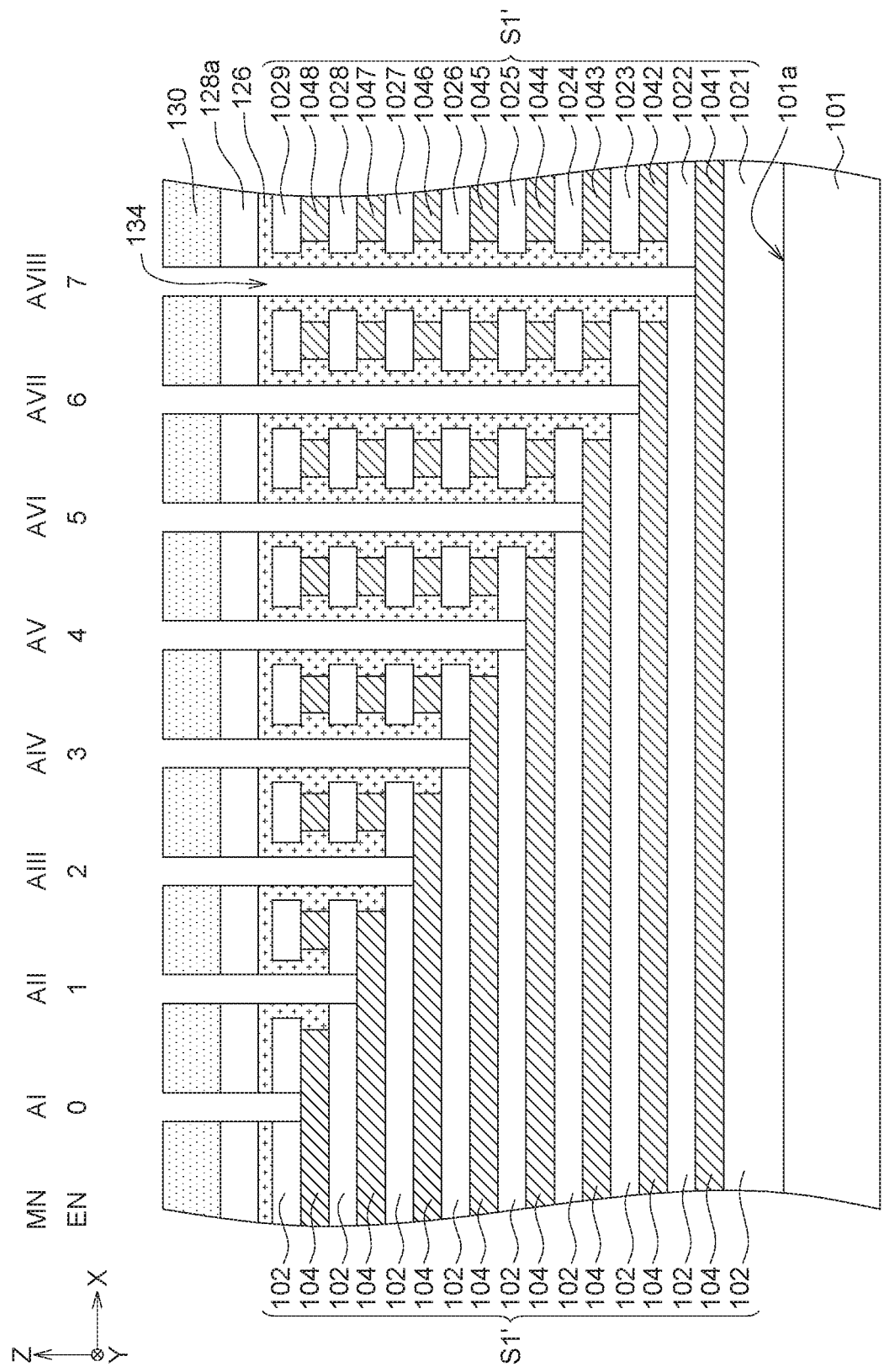
FIG. 15 is a cross-sectional view showing a method for fabricating the multilayer structure subsequent to FIG. 14.

FIG. 15 is a cross-sectional view showing a method for fabricating the multilayer structure 100 subsequent to FIG. 14.

Referring to FIG. 15, the protective layer 126 and the insulating layer 102 disposed under the first etching vias 132 are removed through the first etching via 132 by an etching process to form a plurality of second etching vias 134 exposing the sacrificial layers 104.

Figure 16:
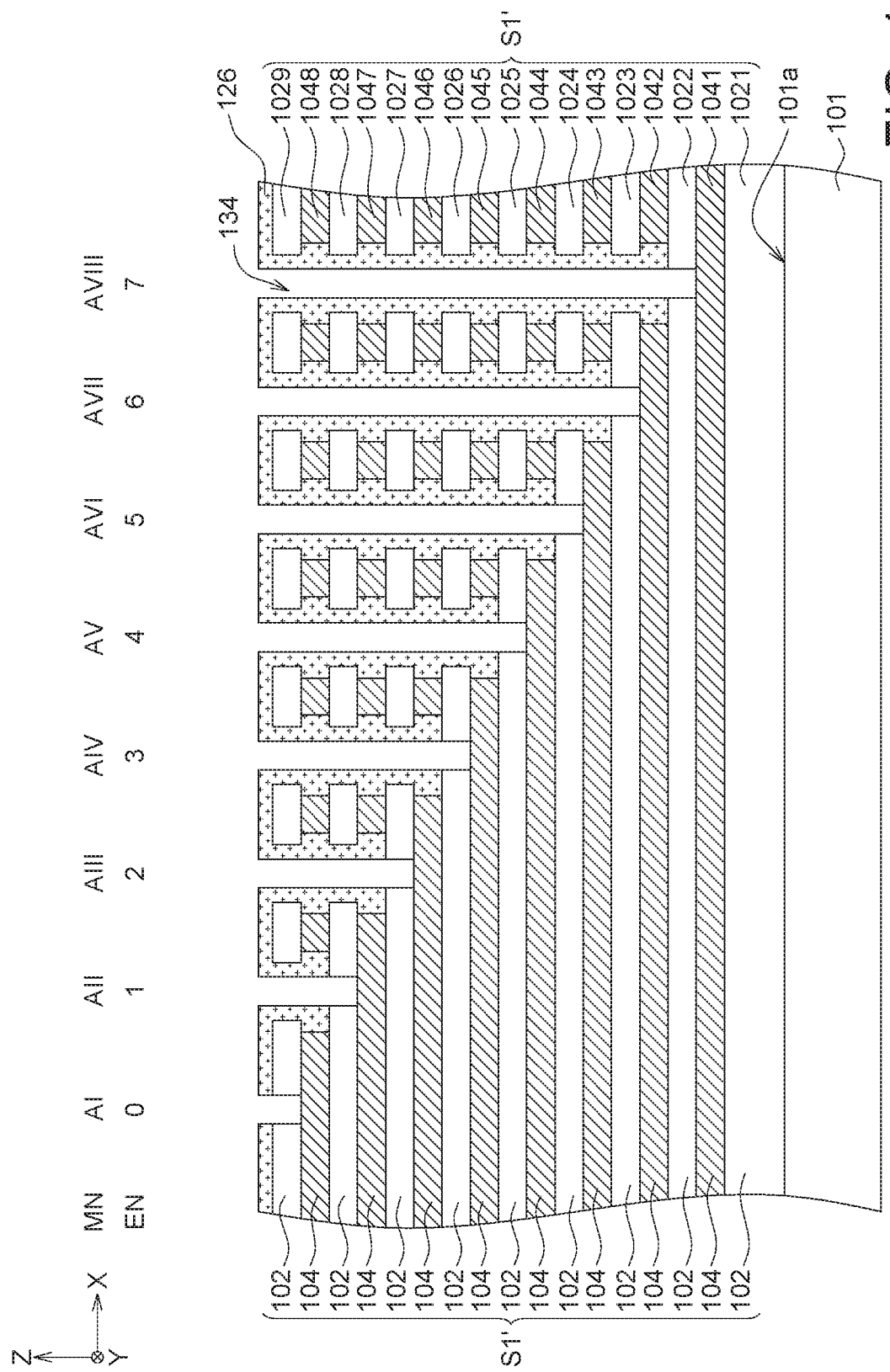
FIG. 16 is a cross-sectional view showing a method for fabricating the multilayer structure subsequent to FIG. 15.

FIG. 16 is a cross-sectional view showing a method for fabricating the multilayer structure 100 subsequent to FIG. 15.

Referring to FIG. 16, the etching mask 130 is removed. The second etching vias 134 may have different depths therebetween, and penetrate portions of the stacked body S1' and the protective layer 126, respectively.

Figure 17A:
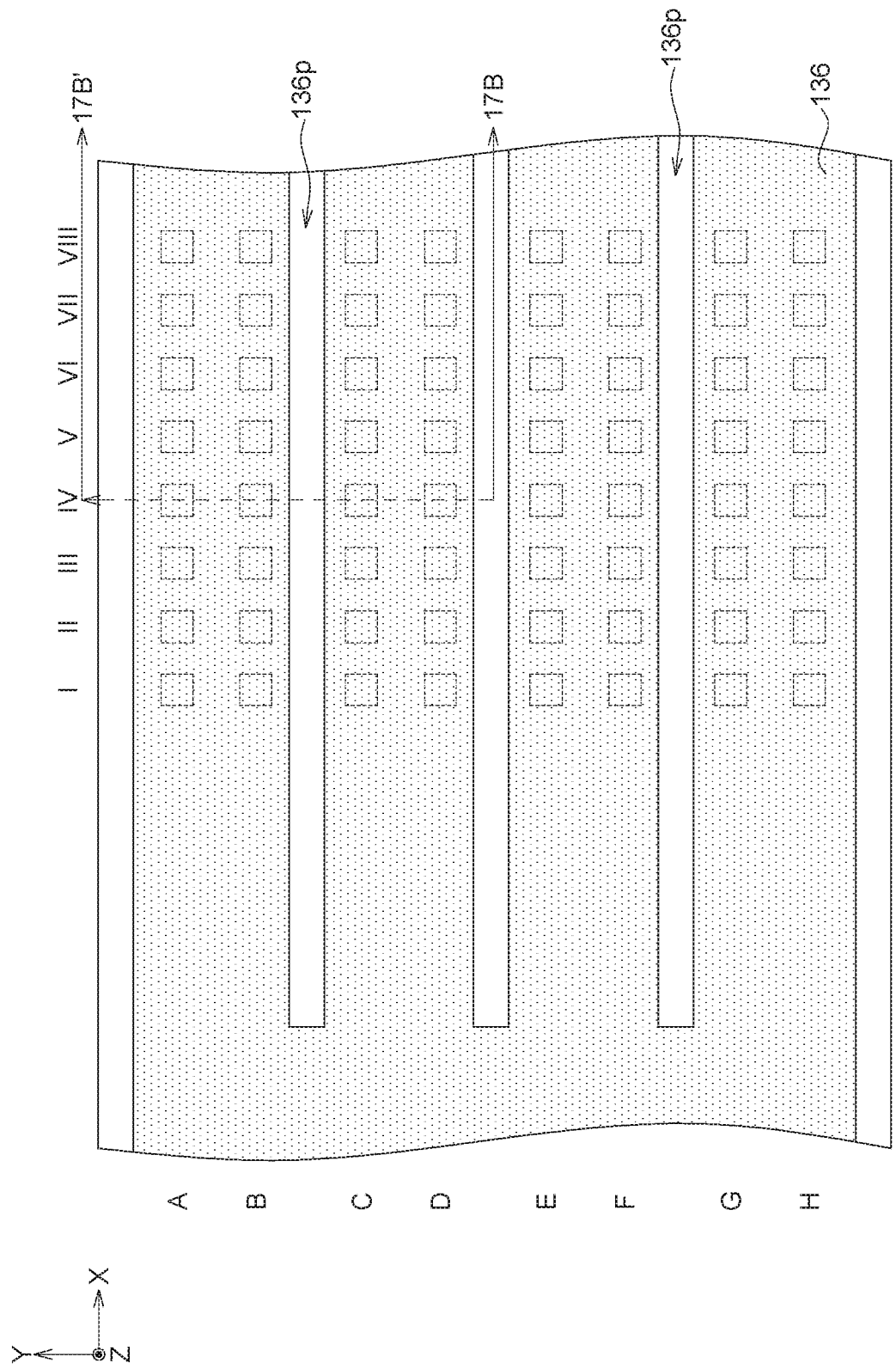
FIG. 17A is a top view showing a method for fabricating the multilayer structure subsequent to FIG. 16.
Figure 17B:
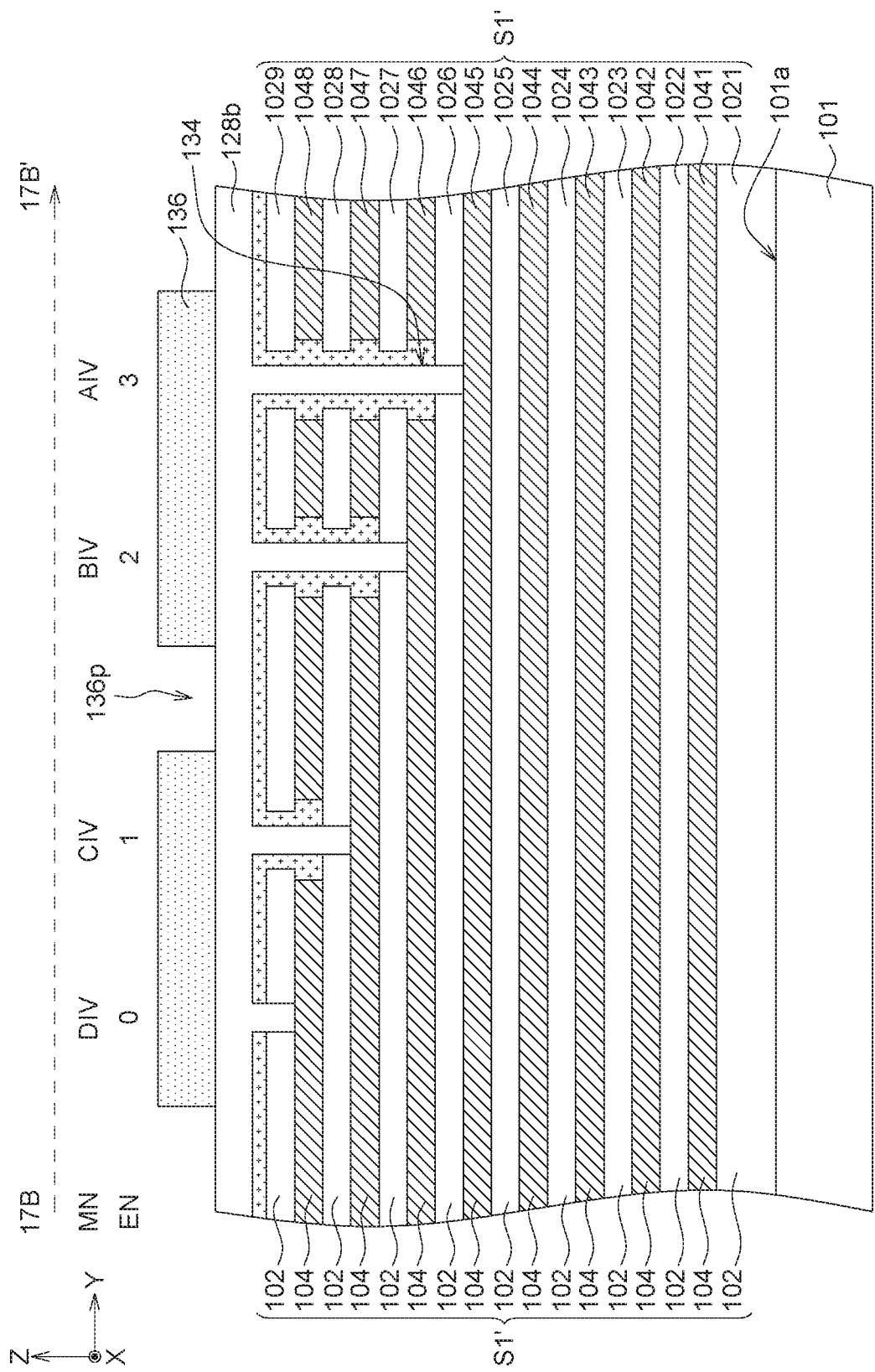
FIG. 17B is a cross-sectional view showing a method for fabricating the multilayer structure 100 subsequent to FIG. 16.

FIG. 17A is a top view showing a method for fabricating the multilayer structure 100 subsequent to FIG. 16. FIG. 17B is a cross-sectional view showing a method for fabricating the multilayer structure 100 subsequent to FIG. 16, wherein FIG. 17B is a cross-sectional view taken along line 17B-17B' of FIG. 17A.

Referring to FIGS. 17A and 17B simultaneously, a second planarization layer 128b is formed on the protective layer 126 and the second etching via 134 by a deposition process. The second planarization layer 128b is formed, for example, of an organic dielectric material. Next, a patterning mask 136 is formed on the second planarization layer 128b, and a plurality of patterning mask openings 136p exposing the second planarization layer 128b are formed. The second planarization layer 128b can provide a flat deposition surface for the patterning mask 136, and the patterning mask 136 can be in direct contact with the second planarization layer 128b. The positions AIV, BIV, CIV, DIV are exemplarily shown in FIG. 17B. The patterning mask openings 136p and the second etched vias 134 are non-overlapped in the normal direction of the upper surface 101a of the substrate 101.

Figure 18:
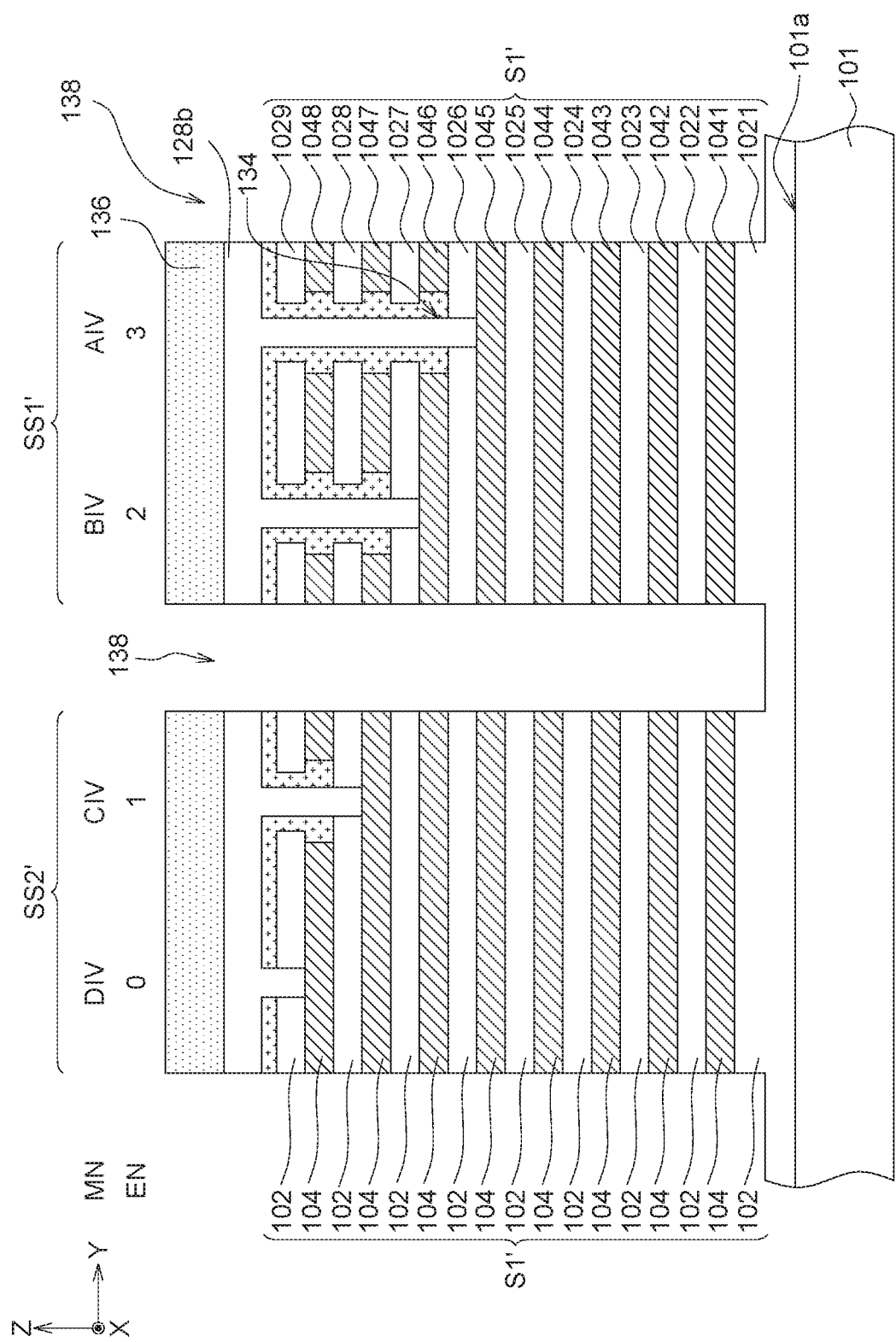
FIG. 18 is a cross-sectional view showing a method for fabricating the multilayer structure subsequent to FIG. 17B.

FIG. 18 is a cross-sectional view showing a method for fabricating the multilayer structure 100 subsequent to FIG. 17B.

Referring to FIG. 18, portions of the second planarization layer 128b and the laminated body S1' are removed through the patterning mask openings 136p by an etching process, to form a plurality of trenches 138 exposing the lowermost insulating layer 1021 of the insulating layers 102. The trenches 138 extend along a first direction (eg, the X direction) and penetrating through all of the sacrificial layers 104 along a third direction (eg, the Z direction) to divide the laminated body S1' into a plurality of sub-laminated bodies (eg, SS1' and SS2') disposed in a second direction (eg, the Y direction). FIG. 18 exemplarily shows two sub-laminated bodies therein, but the invention is not limited thereto. In some embodiments, the first direction, the second direction, and the third direction intersect each other, that is, the first direction, the second direction, and the third direction respectively have a non-flat angle, for example, the angle between the first direction and the second direction may be 90°, the angle between the second direction and the third direction may be 90°, and the angle between the first direction and the third direction may be 90°.

Figure 19:
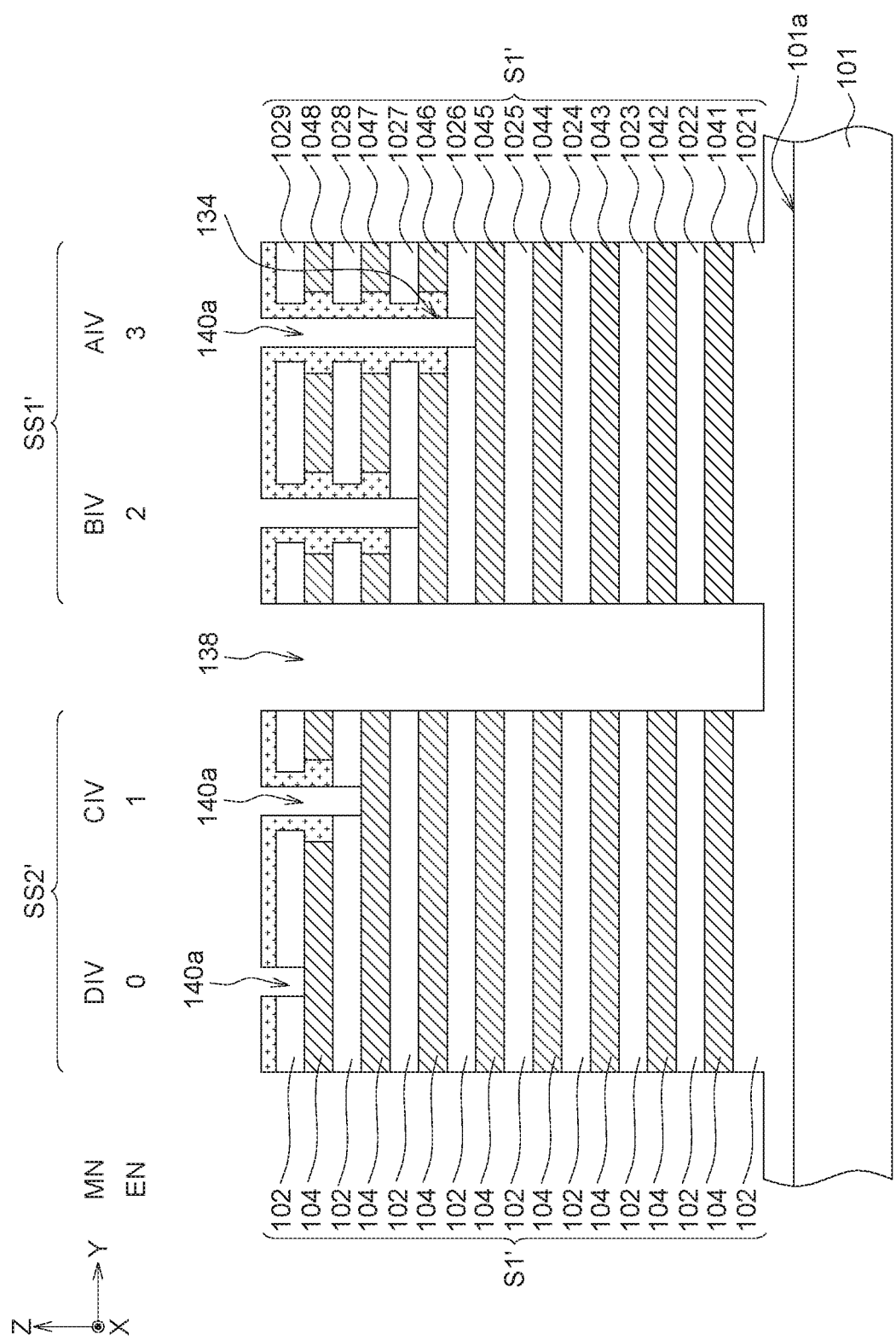
FIG. 19 is a cross-sectional view showing a method of fabricating the multilayer structure subsequent to FIG. 18.

FIG. 19 is a cross-sectional view showing a method of fabricating the multilayer structure 100 subsequent to FIG. 18.

Referring to FIG. 19, the patterning mask 136 and the second planarization layer 128b are removed to expose a plurality of vertical openings 140a. The vertical openings 140a penetrate through portions of the insulating layers 102 and the sacrificial layers 104, and the bottom of the vertical openings 140a expose the corresponding ones of the sacrificial layers 104.

Figure 20:
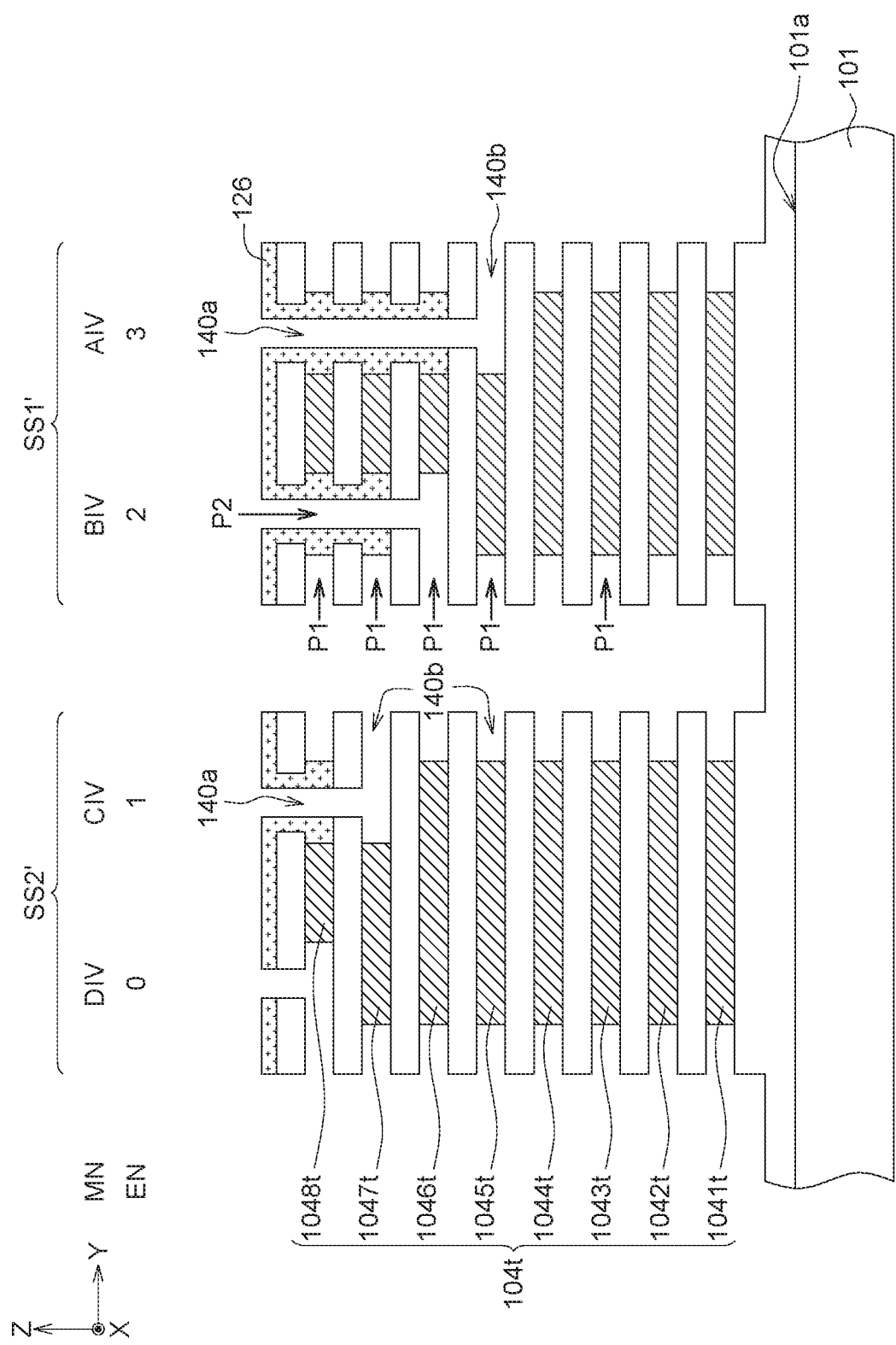
FIG. 20 is a cross-sectional view showing a method for fabricating the multilayer structure subsequent to FIG. 19.

FIG. 20 is a cross-sectional view showing a method for fabricating the multilayer structure 100 subsequent to FIG. 19.

Referring to FIG. 20, portions of the sacrificial layers 104 are selectively removed through the vertical openings 140a and the trenches 138 by an etching process. The sacrificial layers 104 disposed in the middle portions of the sub-laminated bodies (eg, SS1' and SS2') respectively are remained to form a plurality of patterned sacrificial layers 104t (including patterned sacrificial layers 1041t-1048t), and the positions where the sacrificial layers 104 are removed thus form a plurality of lateral openings 140b in the sub-laminated bodies (eg, SS1' and SS2'). The etching process is performed, for example, by an etchant of hot phosphoric acid.

In some embodiments, the etching process may remove portions of the sacrificial layers 104 that are not adjacent to the vertical openings 140a from the trenches 138 through the first etching paths P1 in the lateral direction. For example, at the position BIV of FIG. 20, portions of the sacrificial layers 1041 to 1045 that are not adjacent to the vertical openings 140a are removed from the trenches 138 through the first etching paths P1 in the lateral direction.

In some embodiments, since the etchant may flow in the vertical openings 140a from above, the etching process may remove portions of the sacrificial layers 104 adjacent to the bottom of the vertical openings 140a not only from the trenches 138 through the first etching paths P1 in the lateral direction, but also from the vertical openings 140a through second etching paths P2 in the vertical direction. The protective layer 126 disposed on the sidewalls of the vertical openings 140a block the inflow of the etchant, so that portions of the sacrificial layers 104 adjacent to the protective layer 126 are not removed. For example, at position BIV of FIG. 20, portions of the sacrificial layers 1046 adjacent to the vertical openings 140a are removed from the trenches 138 through the first etching paths P1 in the lateral direction and from the vertical openings 140a through the second etching paths P2 in the vertical direction. In addition, portions of the sacrificial layers 1047 and 1048 adjacent to the protective layer 126 on sidewalls of the vertical openings 140a at positions BIV and AIV are not removed due to being protected by the protective layer 126.

Figure 21:
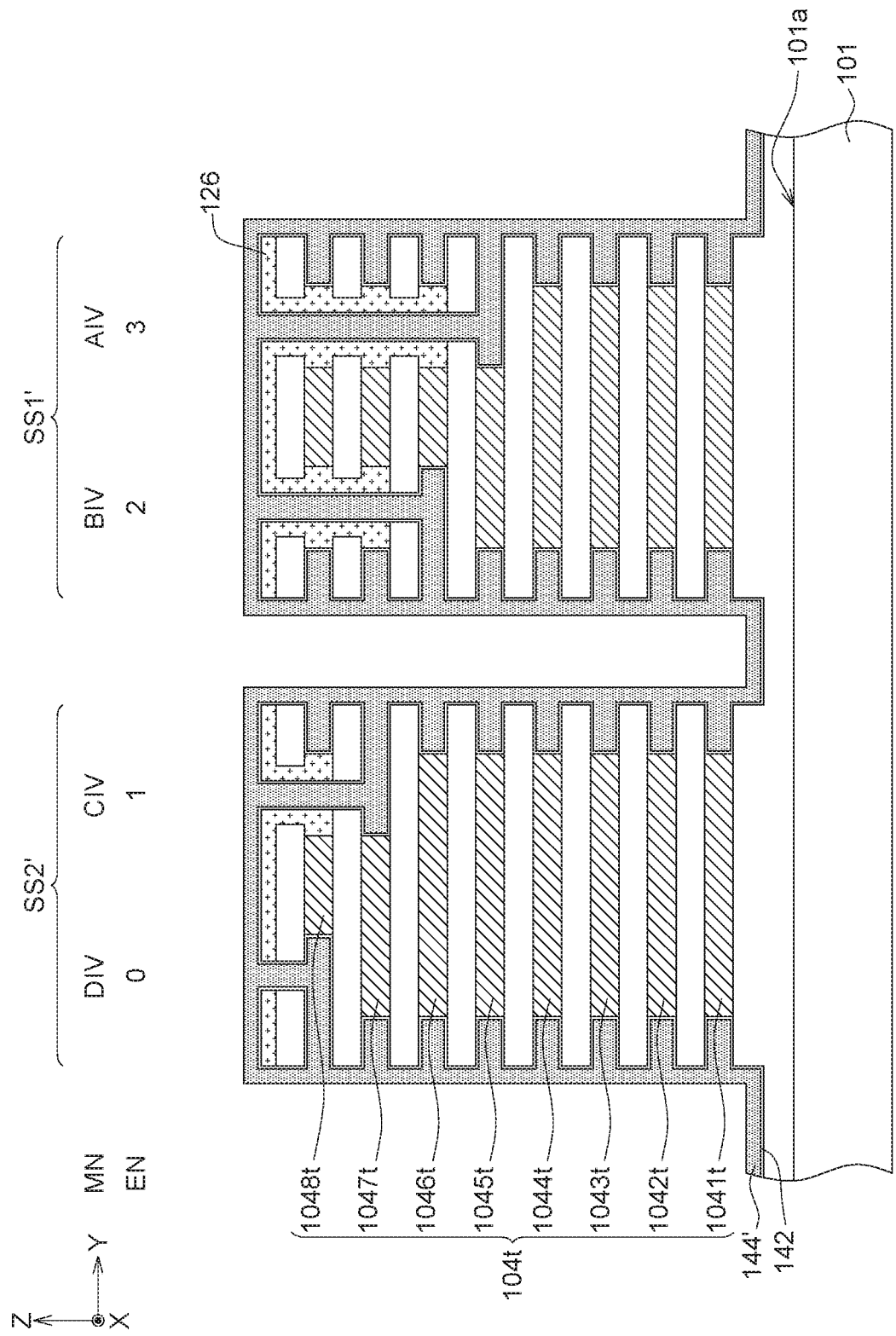
FIG. 21 is a cross-sectional view showing a method for fabricating the multilayer structure subsequent to FIG. 20.

FIG. 21 is a cross-sectional view showing a method for fabricating the multilayer structure 100 subsequent to FIG. 20.

Referring to FIG. 21, a barrier layer 142 is deposited on the sidewalls of the vertical openings 140a and the lateral openings 140b, and then the conductive material 144' is filled in the vertical openings 140a and the lateral openings 140b by a conductor process. And the conductive material 144' covers the sub-laminated bodies (eg, SS1' and SS2'). The conductor process can be, for example, chemical vapor deposition (CVD), atomic layer deposition (ALD), or electroplating. The barrier layer 142 is, for example, titanium (Ti), titanium nitride (TiN), tantalum (Ta), tantalum nitride (TaN), tungsten titanium (WTi), or other suitable materials. Conductive material 144' is, for example, tungsten (W), copper (Cu), or other suitable material.

Figure 22A:
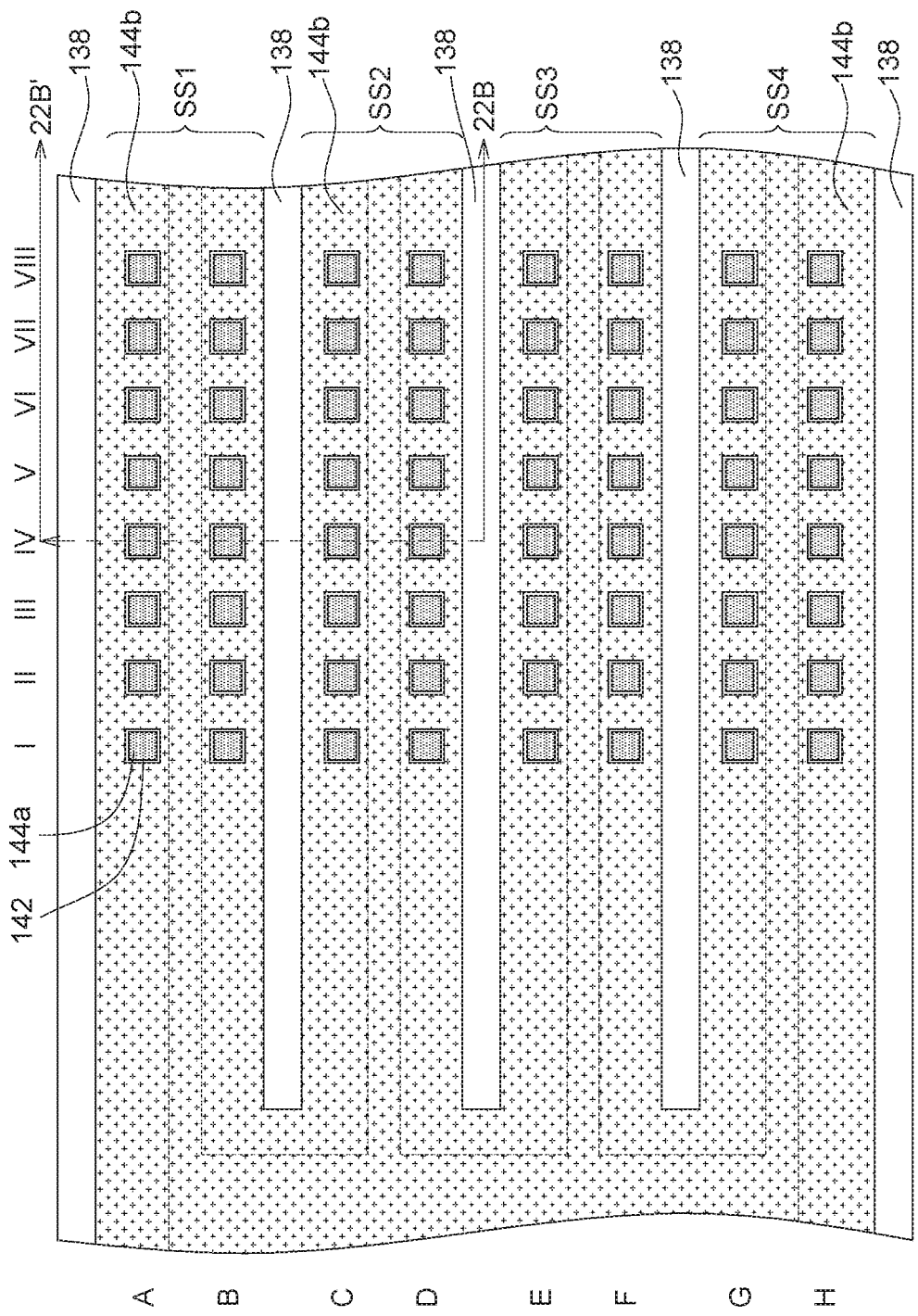
FIG. 22A is a top view showing a method for fabricating the multilayer structure subsequent to FIG. 21.
Figure 22B:
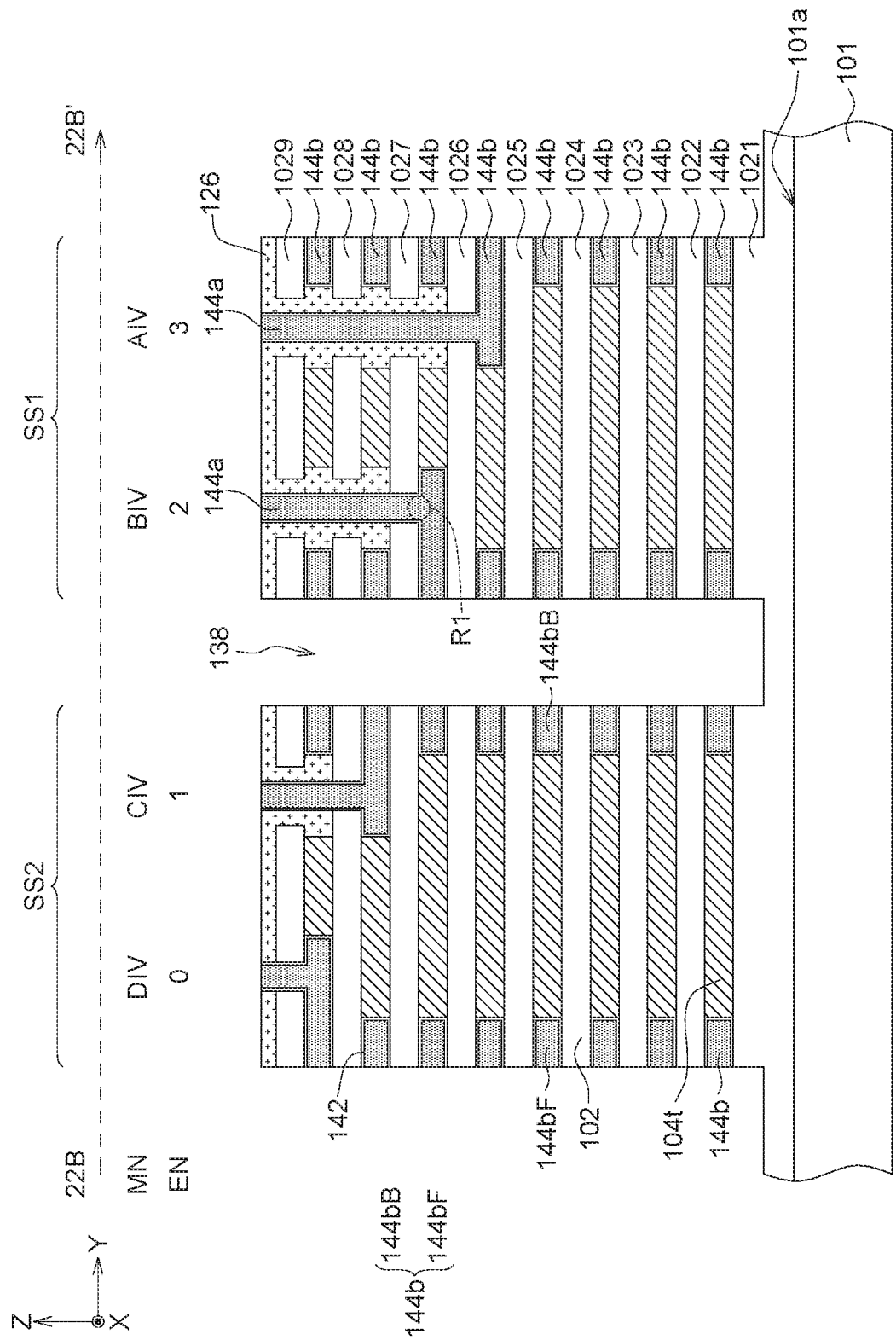
FIG. 22B is a cross-sectional view showing the method for fabricating the multilayer structure 100 of FIG. 21.

FIG. 22A is a top view showing a method for fabricating the multilayer structure 100 subsequent to FIG. 21. FIG. 22B is a cross-sectional view showing the method for fabricating the multilayer structure 100 of FIG. 21, wherein FIG. 22B is a cross-sectional view taken along line 22B-22B' of FIG. 22A.

Referring to FIGS. 22A and 22B simultaneously, the conductive material 144' located outside the vertical openings 140a and the lateral openings 140b is removed to form the interlayer connectors 144a disposed in the vertical openings 140a and the conductive layers 144b disposed in the lateral openings 140b. The patterned sacrificial layers 104t, the conductive layers 144b, and the insulating layers 102 constitute a plurality of sub-stacks (eg, SS1, SS2, etc.) disposed along the second direction (eg, the Y direction). Since the interlayer connectors 144a and the conductive layers 144b are an integral structure formed by the same conductor process at the same time, the interlayer connectors 144a are in direct contact with the underlying conductive layers 144b, contact regions R1 between the interlayer connectors 144a and the underlying conductive layers 144b has no other layer (for example, a barrier layer).

For example, in the position BIV of FIG. 22B, the interlayer connectors 144a are in direct contact with the corresponding conductive layers 104b, and the interlayer connectors 144a and the conductive layers 104b are a continuous integral structure, and contact regions R1 between the interlayer connectors 144a and the conductive layers 104b have no other layer (for example, a barrier layer).

According to some embodiments of the invention, the patterned sacrificial layers 104t are disposed in the middle portion of each of the sub-stacks (eg, SS1, SS2, . . . etc.) Each of the patterned sacrificial layers 104t has a first side FS and a second side BS opposite to the first side FS, the conductive layers 144b corresponding to the first sides FS are referred to as first side conductive layers 144bF, and the conductive layers 144b corresponding to the second sides BS are referred to as second side conductive layers 144bB. In a second direction (eg, the Y direction), the patterned sacrificial layers 104t are disposed between the first side conductive layers 144bF and the second side conductive layers 144bB.

Figure 23B:
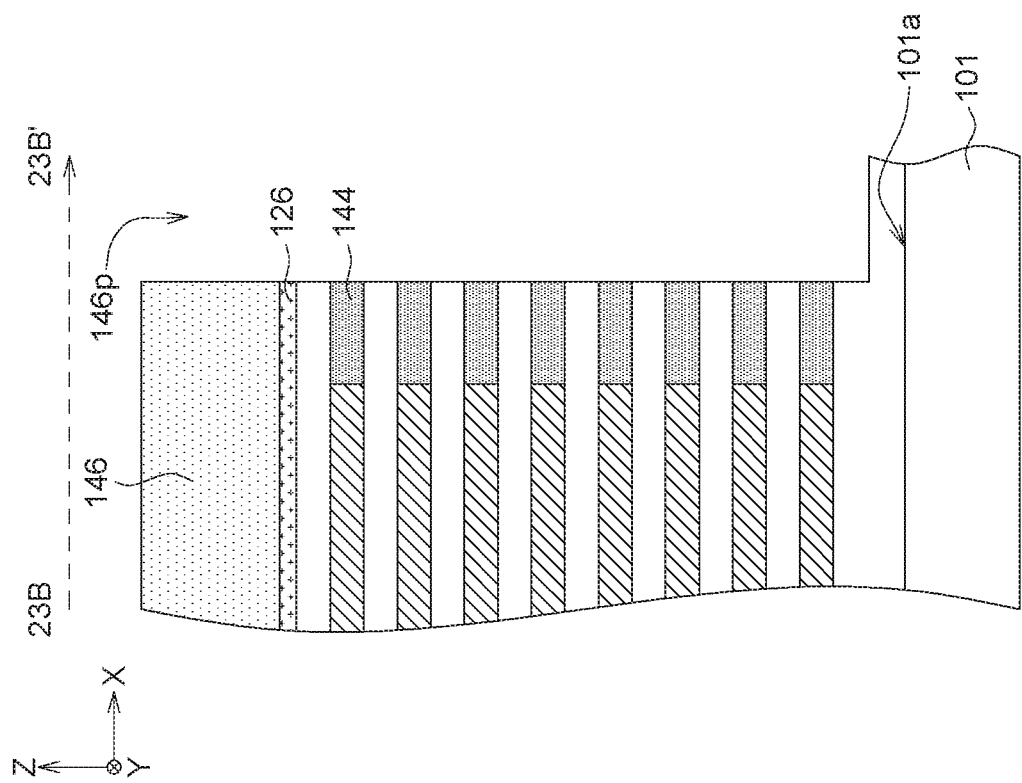
FIG. 23B is a cross-sectional view showing a method for fabricating the multilayer structure subsequent to FIG. 22B.

FIG. 23A is a top view of a method for fabricating the multilayer structure 100 subsequent to FIG. 22A. FIG. 23B is a cross-sectional view showing a method for fabricating the multilayer structure 100 subsequent to FIG. 22B, wherein FIG. 23B is a cross-sectional view taken along line 23B-23B' of FIG. 23A.

Referring to FIGS. 23A and 23B, a trimming mask 146 is formed on the protective layer 126, and a plurality of trimming mask openings 146p exposing the bottommost insulating layer 102l are formed. In some embodiments, the trimming mask openings 146p are used to remove excess portions of the conductive layers 144b to avoid short circuits.

Figure 24:
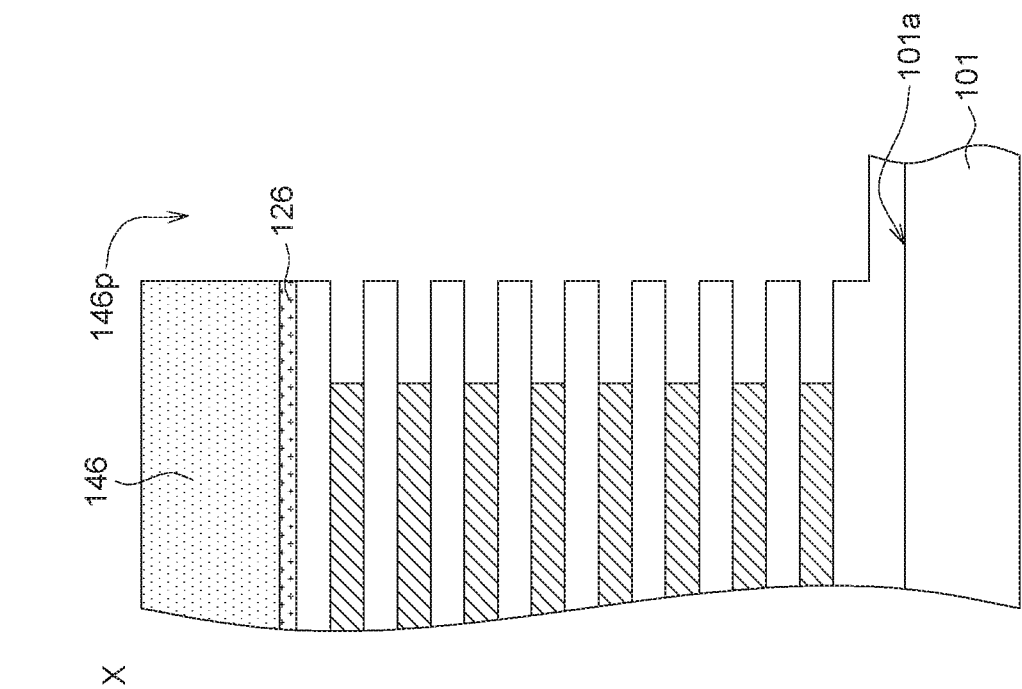
FIG. 24 is a cross-sectional view showing a method for fabricating the multilayer structure subsequent to FIG. 23B.

FIG. 24 is a cross-sectional view showing a method for fabricating the multilayer structure 100 subsequent to FIG. 23B.

Referring to FIG. 24, the excess portions of the conductive layers 144b are removed by an etching process. The etching process is, for example, an isotropic etching process.

Figure 25C:
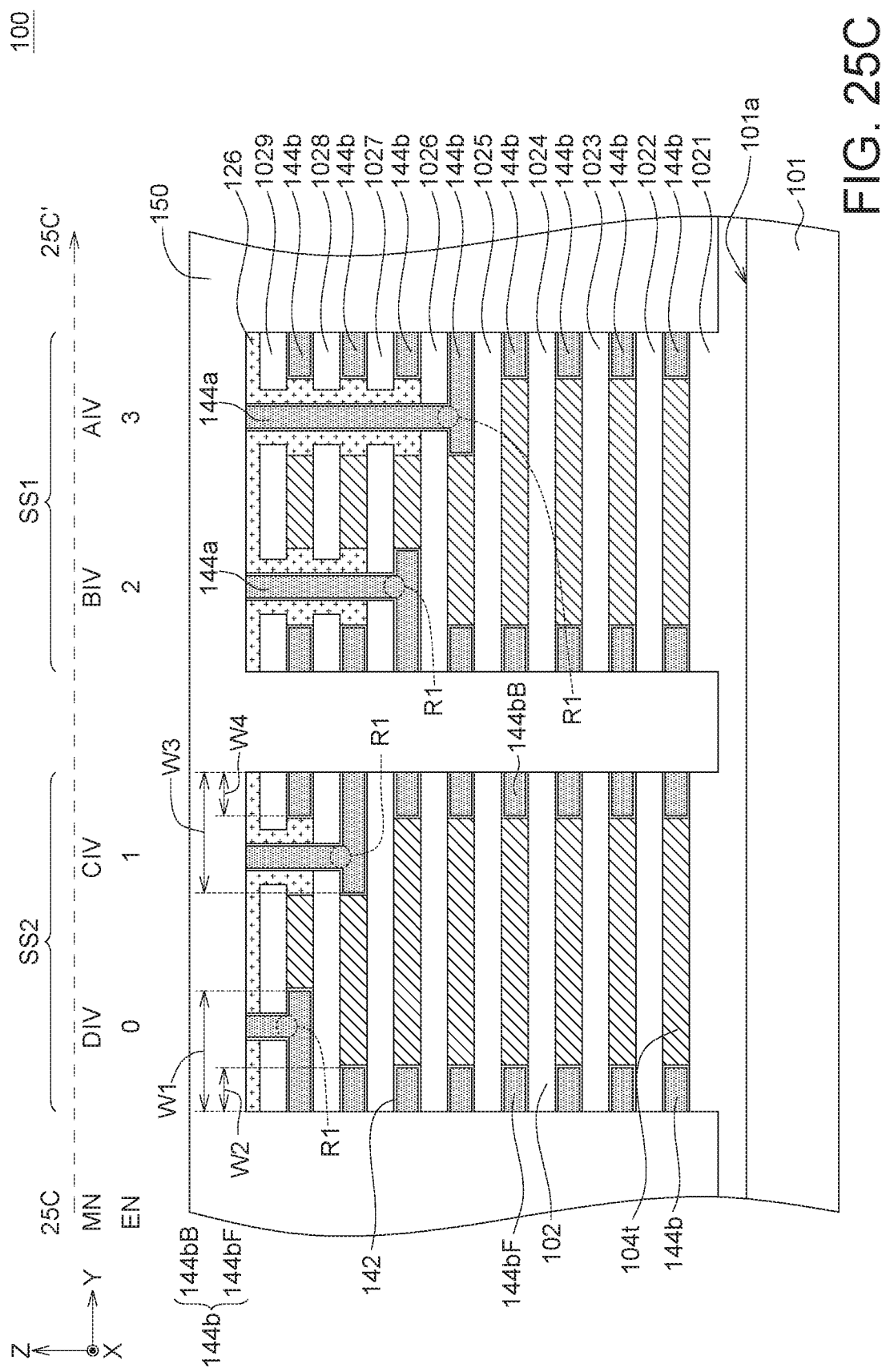
FIG. 25C is a cross-sectional view showing the method for fabricating the multilayer structure subsequent to FIG. 24.

FIG. 25A is a top view showing a method for fabricating the multilayer structure 100 subsequent to FIG. 24. FIG. 25B is a cross-sectional view showing a method for fabricating the multilayer structure 100 subsequent to FIG. 24, wherein FIG. 25B is a cross-sectional view taken along line 25B-25B' of FIG. 25A. FIG. 25C is a cross-sectional view showing the method for fabricating the multilayer structure 100 subsequent to FIG. 24, wherein FIG. 25C is a cross-sectional view taken along line 25C-25C' of FIG. 25A.

Referring to FIGS. 25A-25C simultaneously, the trimming mask 146 is removed. Thereafter, the oxide material 150 is deposited on the protective layer 126, on the bottommost insulating layer 102l, and the positions where the excess portions of the conductive layers 144b are removed, and the multilayer structure 100 is formed. In other words, the oxide material 150 covers the sub-stacks SS1, SS2, SS3, and SS4, and fills the space between the sub-stacks SS1, SS2, SS3, and SS4. The maximum widths of the first side conductive layers 244bF and the second conductive layers 244bB in the second direction (for example, the Y direction) are exemplarily shown in FIG. 25A. The relationships between the widths of the first side conductive layers 244bF in different layers and between the widths of the second side conductive layer 244bB in different layers respectively can be understood by referring to FIG. 25C.

According to an embodiment of the present invention, a multilayer structure 100 is provided. The multilayer structure 100 includes a substrate 101 and a plurality of sub-stacks SS1 to SS4 disposed on the upper surface 101a of the substrate 101. This embodiment exemplarily shows four sub-stacks, but the invention is not limited thereto. The sub-stacks SS1 to SS4 are separated by an oxide material 150. The sub-stacks SS1 to SS4 respectively extend along a first direction (for example, the X direction) and are disposed on the upper surface 101a along the second direction (for example, the Y direction). Each of the sub-stacks SS1 to SS4 includes a plurality of insulating layers 102, a plurality of patterned sacrificial layers 104t, a plurality of conductive layers 144b, a plurality of interlayer connectors 144a, a protective layer 126, and a plurality of barrier layers 142.

The insulating layers 102 and the patterned sacrificial layers 104t are alternately stacked on the upper surface 101a along a third direction (for example, the Z direction). The conductive layers 144b and the insulating layers 102 are alternately stacked on the upper surface 101a along a third direction (for example, the Z direction). Each of the conductive layers 144b is coplanar with a corresponding patterned sacrificial layer 104t. The bottommost insulating layers 102 of the sub-stacks SS1 to SS4 may be connected to each other. The interlayer connectors 144a penetrate through portions of the sub-stacks SS1 to SS4, and extend in a third direction (eg, the Z direction), and the bottom of each of the interlayer connectors 144a is in direct contact with the corresponding conductive layer 144b. Since the interlayer connectors 144a and the conductive layers 144b are simultaneously formed by the same conductor process, each of the interlayer connectors 144a and the corresponding conductive layers 144b may be an integral structure, and the contact regions R1 between the interlayer connectors 144a and the corresponding conductive layers 144b do not have other layers (for example, a barrier layer).

According to some embodiments of the invention, the patterned sacrificial layers 104t are disposed in the middle portion of each of the sub-stacks (eg, SS1, SS2, SS2, SS3).

Each of the patterned sacrificial layers 104t has a first side FS and a second side BS opposite to the first side FS. The conductive layers 144b includes a plurality of first side conductive layers 144bF and a plurality of second side conductive layers 144bB, wherein the conductive layers 144b corresponding to the first side FS are the first side conductive layers 144bF, the conductive layer 144b corresponding to the second side BS 144b are the second side conductive layers 144bB. In a second direction (eg, the Y direction), the patterned sacrificial layers 104t are between the first side conductive layers 144bF and the second side conductive layers 144bB.

In some embodiments, the first side conductive layers 144bF overlapped with the interlayer connectors 144a in a third direction (eg, the Z direction) (ie, the first side conductive layers 144bF that are in direct contact with the interlayer connectors 144a) have a first width W1 in the second direction (for example, the Y direction), and the first side conductive layers 144bF non-overlapped with the interlayer connectors 144a in a third direction (eg, the Z direction) (ie, the first side conductive layers 144bF that are not in contact with the interlayer connectors 144a) have a second width W2 in the second direction (for example, the Y direction), and the first width W1 is larger than the second width W2.

Similarly, the second side conductive layers 144bB overlapped with the interlayer connectors 144a in a third direction (eg, the Z direction) (ie, the second side conductive layers 144bB that are in direct contact with the interlayer connectors 144a) have a third width W3 in the second direction (for example, the Y direction), and the second side conductive layers 144bB non-overlapped with the interlayer connectors 144a in a third direction (eg, the Z direction) (ie, the second side conductive layers 144bB that are not in contact with the interlayer connectors 144a) have a fourth width W4 in the second direction (for example, the Y direction), and the third width W3 is larger than the fourth width W4.

In some embodiments, the first width W1 may be equal to the third width W3, and the second width W2 may be equal to the fourth width W4.

In some embodiments, the first side conductive layers 144bF have a first length L1 in the first direction (eg, X direction) and the second side conductive layers 144bB have a second length L2 in the first direction (eg, an X direction), and the first length L1 may be equal to the second length L2.

In some embodiments, the cross-sections of the interlayer connectors 144a (eg, the plane in the X and Y directions) may be rectangular, circular, elliptical, or any shape.

In some embodiments, the protective layer 126 covers the uppermost insulating layer 1029 and surrounds the interlayer connectors 144a. The protective layer 126 may be disposed between the uppermost insulating layer 1029 and the oxide material 150. The oxide material 150 can be the same material as the insulating layer 102, such as silicon dioxide.

In some embodiments, the other conductive layers 144b on the same side of the patterned sacrificial layer 104t have the same width in the second direction (eg, the Y direction) except for the conductive layers 144b that are directly connected to the interlayer connectors 144a.

In some embodiments, the barrier layers 142 surround the interlayer connectors 144a and the conductive layers 144b. The barrier layers 142 can be disposed between the interlayer connectors 144a and the protective layer 126, between the patterned sacrificial layers 104t and the conductive layers 144b, and between the insulating layers 102 and the interlayer connectors 144a.

In some embodiments of the present invention, since a plurality of conductive layers 144b (for example, 8 layers of conductive layers 144b) and a plurality of interlayer connectors 144a can be formed by the same conductor process, in comparison with a comparative example requiring multiple deposition processes for forming the barrier layer, the conductive layers and the interlayer connectors, the process method of the present invention can decrease the complexity of the process, reduce the amount of the conductive material, and lower the cost.

FIGS. 26A-27C are top views, cross-sectional views, and perspective views of a method for fabricating a multilayer structure 200 in accordance with a further embodiment of the present invention. The structure and fabrication process of the multilayer structure 200 are similar to the multilayer structure 100, the differences are in the design of the interlayer connection 244a, and the formation of the conductive wires 254 after forming the oxide material 250 to transfer signals into the multilayer structure 200. Elements in the multilayer structure 200 that are the same or similar to the multilayer structure 100 use the same or similar element symbols. Some detailed descriptions will not be repeated.

Figure 26A:
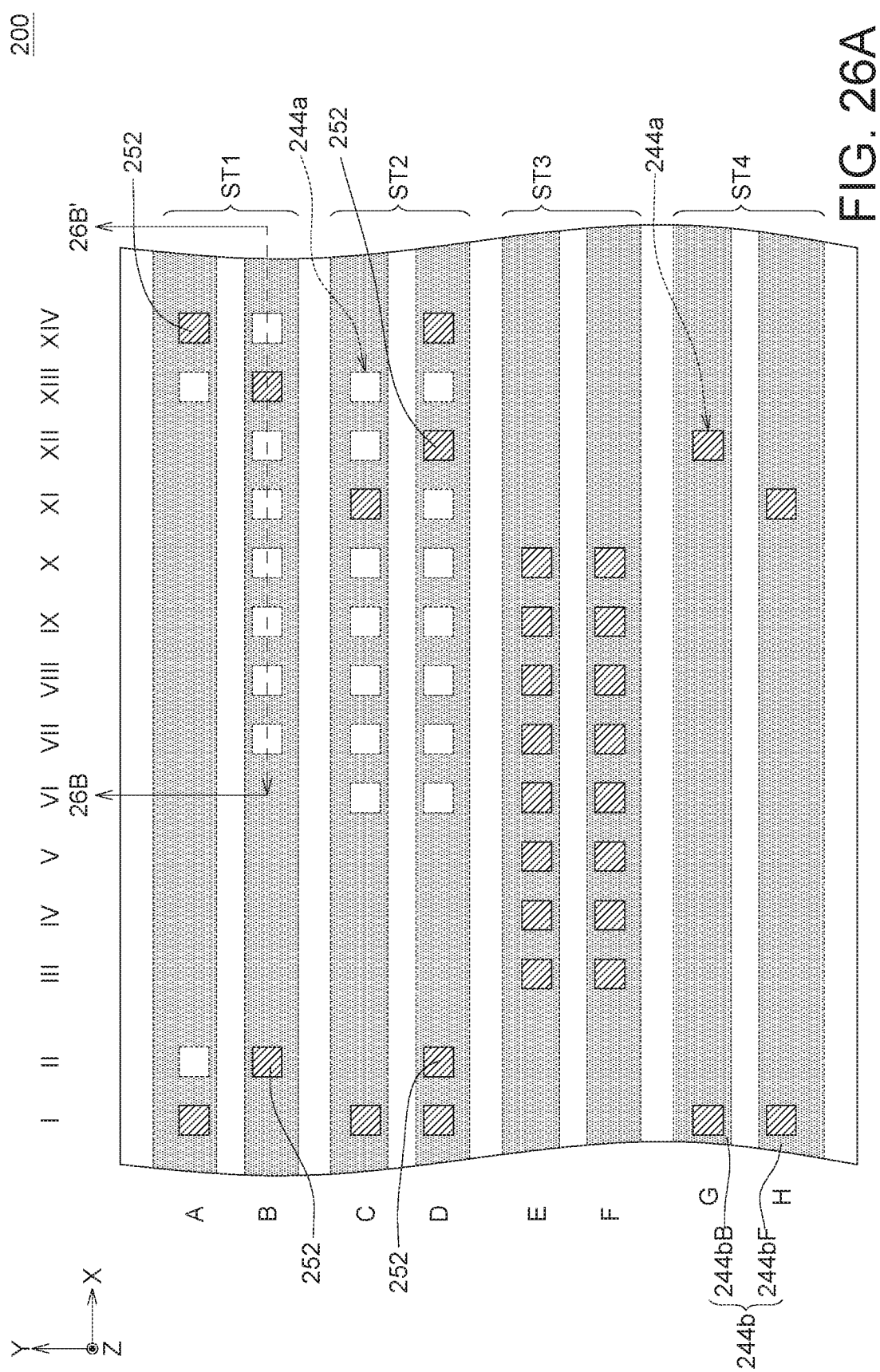
FIG. 26A is a top view of a multilayer structure after forming upper vias according to a further embodiment of the present invention.

FIG. 26A is a top view of a multilayer structure 200 after forming upper vias 252 according to a further embodiment of the present invention, and FIG. 26B is a cross-sectional view of taken along line 26B-26B' of FIG. 26A.

Referring to FIGS. 26A-26B simultaneously, after the step of forming the oxide material 250 (similar to the step shown in FIGS. 25A-25C), a plurality of upper openings 250p are formed penetrating the oxide material 250 disposed above the protective layer 226, thereafter a conductive material is deposited in the upper openings 250p to form a plurality of upper vias 252.

In some embodiments, the upper vias 252 may correspond to portions of the interlayer connectors 244a, and do not correspond to all of the interlayer connectors 244a, depending on the requirements. Therefore, portions of the interlayer connectors 244a are electrically connected to the upper vias 252, and other portions of the interlayer connectors 244a are floating, and are not electrically connected to any of the upper vias 252, but are covered by the oxide material 250. Therefore, the plurality of interlayer connectors 244a of the present invention can provide a wide selection of circuit designs, and the user can perform circuit design depending on the requirements.

The positions I to XIV indicated along the first direction (for example, the X direction) and the positions A to H indicated along the second direction (for example, the Y direction) in FIG. 26A can be used to indicate the coordinate position of the interlayer connectors 244a. For example, the interlayer connector 244a disposed at the position BXIII (row B, column XIII) in FIG. 26A is the interlayer connector 244a electrically connected to the upper via 252 in FIG. 26B.

The multilayer structure 200 includes a substrate 101 and a plurality of sub-stacks ST1 to ST4 disposed on the upper surface 101a of the substrate 101. The present embodiment exemplarily shows four sub-stacks, but the invention is not limited thereto. The sub-stacks ST1 to ST4 can be separated by an oxide material 250. The sub-stacks ST1 to ST4 respectively extend along a first direction (for example, the X direction) and are arranged along the second direction (for example, the Y direction). Each of the sub-stacks ST1 to ST4 includes a plurality of insulating layers 202, a plurality of patterned sacrificial layers 204t (shown in FIG. 27C), a plurality of conductive layers 244*b*, a plurality of interlayer connectors 244*a*, a protective layer 226, and a plurality of barrier layers 242.

In some embodiments, the bottom of the interlayer connectors 244*a* are in direct contact with the corresponding conductive layers 244*b*. Since the interlayer connectors 244*a* and the conductive layers 244*b* are simultaneously formed by the same conductor process, the interlayer connectors 244*a* and the corresponding conductive layers 244*b* may be integral structures, and the contact regions between the interlayer connectors 244*a* and the corresponding conductive layers 244*b*. R2 do not have the other layers (for example, a barrier layer).

According to some embodiments of the invention, the patterned sacrificial layers 204*t* (shown in FIG. 27C) are disposed in the middle portion of each of the sub-stacks (eg, SS1, SS2, SS2, SS3). Each of the patterned sacrificial layers 204*t* (shown in FIG. 27C) has a first side and a second side opposite to the first side. The conductive layers 244*b* includes a plurality of first side conductive layers 244*b*F and a plurality of second side conductive layers 244*b*B, wherein the conductive layers 244*b* corresponding to the first sides are the first side conductive layers 244*b*F, and the conductive layers 244*b* corresponding to the second sides are the second side conductive layers 244*b*B. In the second direction (eg, the Y direction), the patterned sacrificial layers 204*t* (shown in FIG. 27C) are disposed between the first side conductive layers 244*b*F and the second side conductive layers 244*b*B.

The numbers 0 to 7 above the conductive layer 244*b* of FIG. 26A and the etching pairs EN above the FIG. 26B indicate the amount of pair(s) of the insulating layers 202 and the sacrificial layers 204 penetrated by third initial vias (similar to third initial vias 122 in FIG. 10B) which are formed during the process for the interlayer connectors 244*a*. In the present embodiment, the interlayer connectors 244*a* are distributed in eight rows (for example, rows A to H), and the number of interlayer connectors 244*a* in different rows may be different or may be identical to each other depending on the requirements.

Figure 27A:
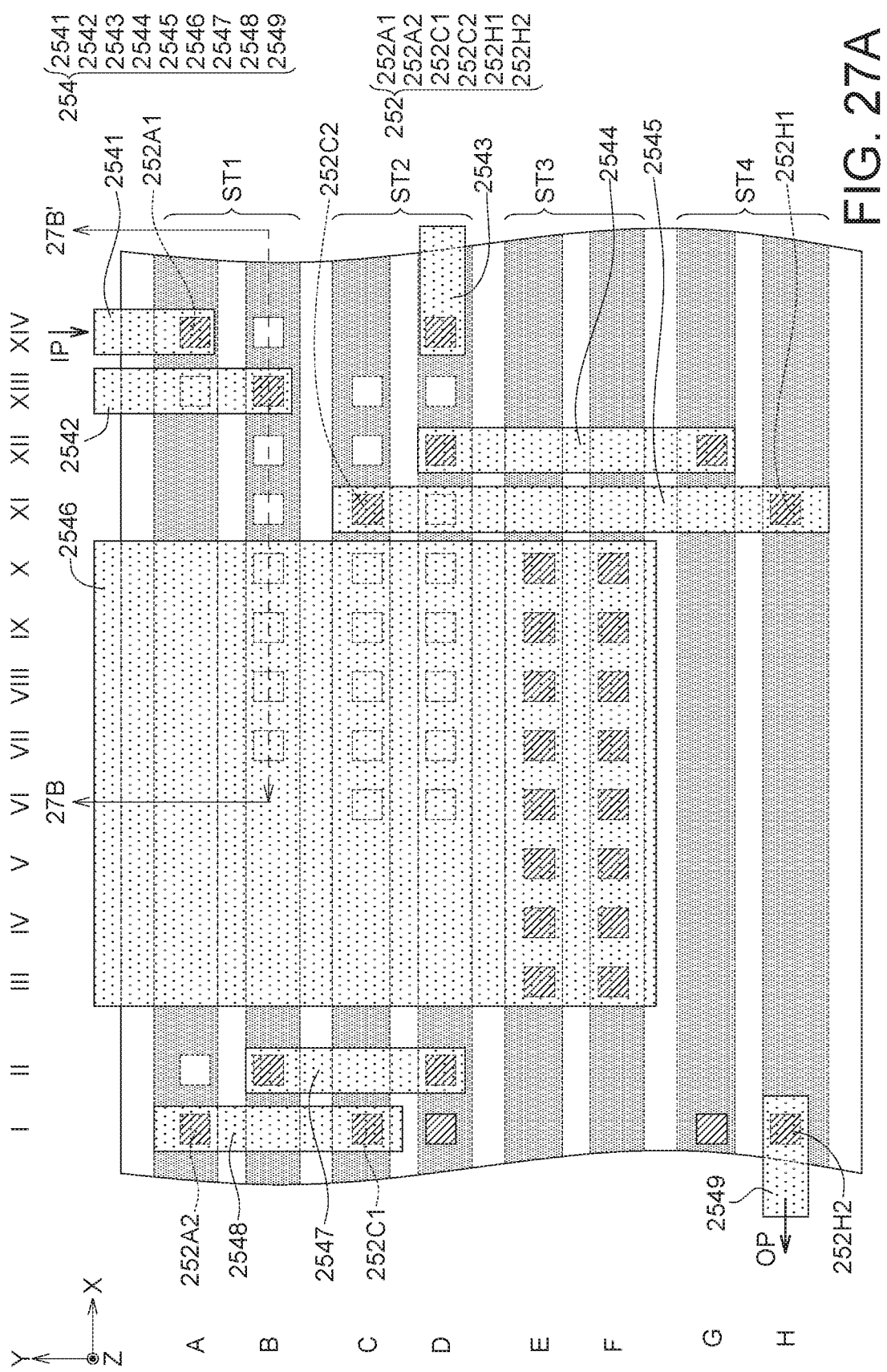
FIG. 27A is a top view showing a method for fabricating the multilayer structure subsequent to FIG. 26A.
Figure 27B:
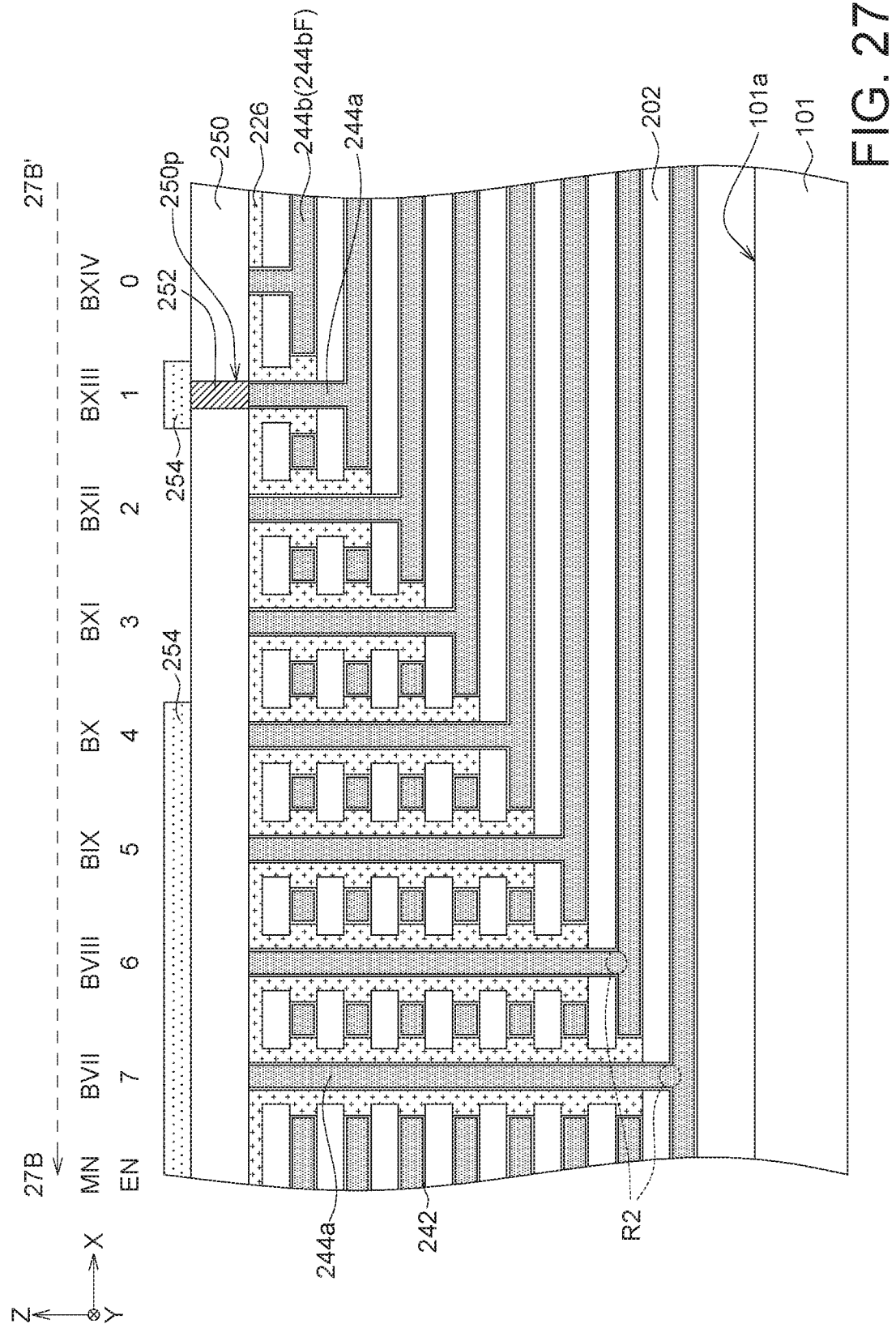
FIG. 27B is a cross-sectional view taken along line 27B-27B' in FIG. 27A.
Figure 27C:
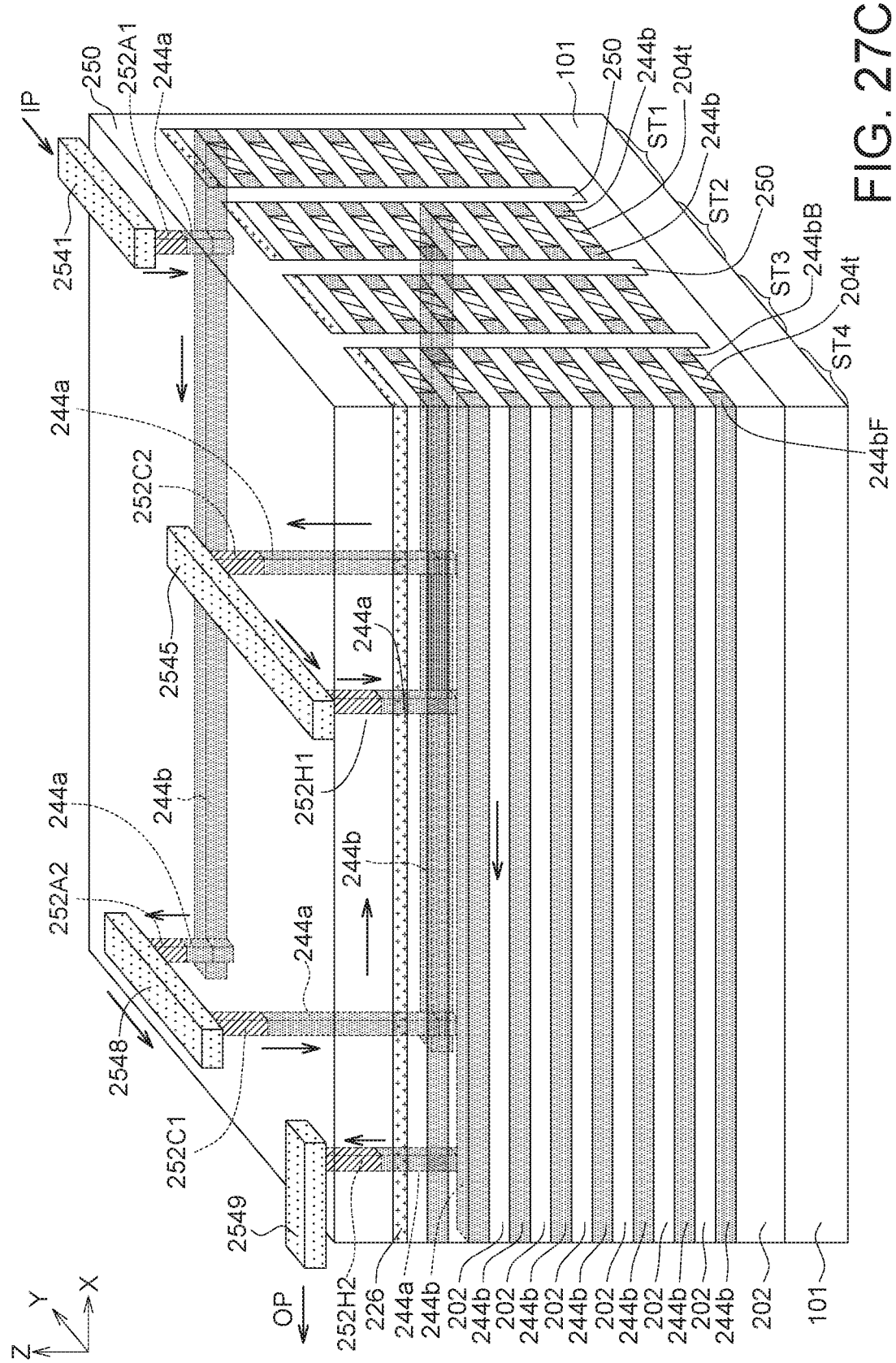
FIG. 27C is a simplified perspective view of FIG. 27A.

FIG. 27A is a top view showing a method for fabricating the multilayer structure 200 subsequent to FIG. 26A, and FIG. 27B is a cross-sectional view taken along line 27B-27B' in FIG. 27A, and FIG. 27C is a simplified perspective view of FIG. 27A.

Referring to FIGS. 27A-27C, a plurality of conductive wires 254 (including conductive wires 2541 to 2549) are formed on the oxide material 250, and the conductive wires 254 may extend in a direction parallel to the upper surface 101*a* of the substrate 101. That is, the conductive wires 254 may extend along a first direction (eg, the X direction) (eg, conductive wires 2543 and 2549) or along a second direction (eg, the Y direction) (eg, conductive wires 2541~2542 and 2544~2548). The length or width of the conductive wires 254 may be the same or different from one another, depending on the requirements. For example, in a first direction (eg, the X direction), the width of the conductive wire 2546 can be greater than the width of the conductive wire 2542. Each of the conductive wires 254 is electrically connected to the corresponding upper vias 252, the interlayer connectors 244*a*, and the conductive layers 244*b*. A portion of the conductive wires 254 can serve as a signal input (eg, conductive wires 2541~2542) and a portion of the conductive wire 254 can serve as a signal output (eg, conductive wires 2543, 2549). The signal can enter the multi-layer structure 200 from the signal input and be transmitted from the signal output to the target component.

For example, referring to FIGS. 27A and 27C at the same time, after the signal enters the multilayer structure 200 through the conductive wire 2541 as the signal input terminal IP, the signal passes through the upper via 252A1 and the interlayer connectors disposed at the position AXIV (row A, column XIV), and enters the second side conductive layer 244*b*B disposed in the eighth layer of the sub-stack ST1, and is then transferred upward to the interlayer connector 244*a* at the position AI (row A and column A), the upper via 252A2, and the conductive wire 2548. Next, the signal is transferred to the upper via 252C1 through the conductive wire 2548 and the interlayer connector 244*a* at the position CI (row C and column I), into the second side conductive layer 244*b*B of the fourth layer in the sub-stack ST2, and then is transmitted upwardly to the interlayer connector 244*a* at the position CXI (row C and column XI), the upper via 252C2, and the conductive wire 2545. Thereafter, the signal is transferred to the upper via 252H1 through the conductive wire 2545 and the interlayer connector 244*a* at the position HXI (row H and column XI), and enters the first side conductive layer 244*b*F of the seventh layer in the sub-stack ST4, and then is transmitted upwardly to the interlayer connector 244*a* at the position HI (row H, column I), the upper via 252H2, and the conductive wire 2549 as the signal output terminal OP, and is delivered to the target component. FIG. 27C of the present invention only exemplarily illustrates one path of the signal transmissions, but the invention is not limited thereto.

Figure 28:
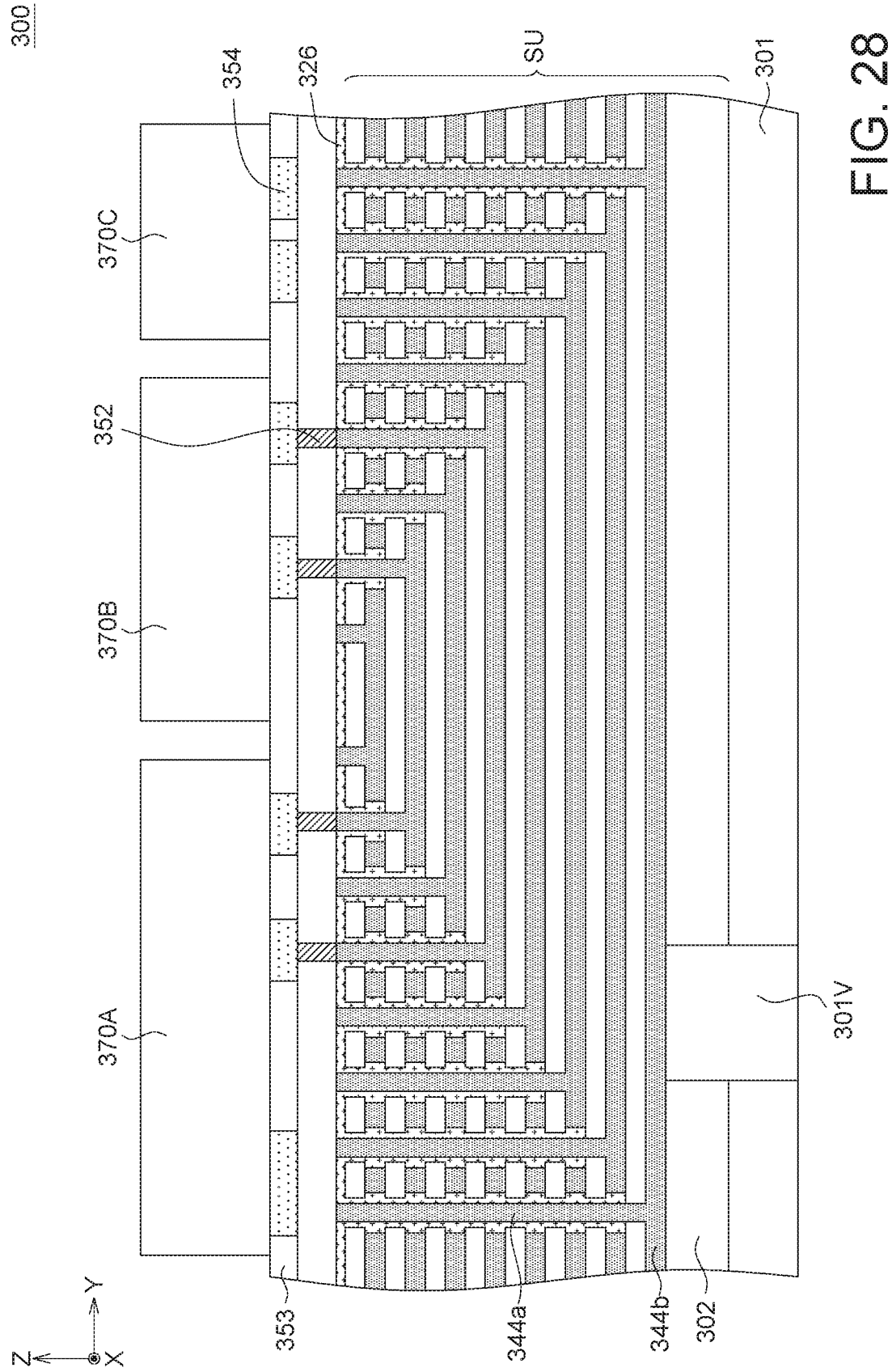
FIG. 28 is a cross-sectional view of a multilayer structure in accordance with a further embodiment of the present invention.

FIG. 28 is a cross-sectional view of a multilayer structure 300 in accordance with a further embodiment of the present invention. The structure and fabrication process of the multilayer structure 300 are similar to the multilayer structure 100, the difference is in the design of the interlayer connectors 344*a* and a substrate via 301V formed in the substrate 301. Additionally, conductive wires 354 electrically connected to chips (e.g. chips 370A, 370B and 370C) disposed on the multilayer structure 300 are formed after forming an oxide material 350. Elements in the multilayer structure 300 that are the same or similar to the multilayer structure 100 use the same or similar element symbols. Some detailed descriptions will not be repeated.

Referring to FIG. 28, the multilayer structure 300 includes a substrate 301 and a plurality of sub-stacks (this figure exemplarily shows one sub-stack SU). The sub-stacks respectively extend along the first direction (for example, X direction) and are disposed on the upper surface 301*a* of the substrate 301 along a second direction (for example, Y direction). Each of the sub-stacks includes a plurality of insulating layers 302 and a plurality of patterned sacrificial layers (not shown) alternately stacked along a third direction (eg, Z direction), includes a plurality of conductive layers 344*b* stacked alternately with the insulating layer 302 along a third direction (eg, Z direction), and includes a plurality of interlayer connectors 344*a*. The patterned sacrificial layers have first sides and second sides (not shown) opposite to the first sides, and the conductive layers 344*b* include a plurality of first side conductive layers corresponding to the first sides and a plurality of second side conductive layers corresponding to the second sides (not shown). The plurality of interlayer connectors 344*a* respectively extend along the third direction and are electrically connected to the corresponding conductive layers 344*b*. A protective layer 326 surrounds interlayer connectors 344*a*. The sub-stacks (eg. SU) are covered by an oxide material 350. The upper vias 352 penetrates through the oxide material 350 in a third direction (eg, Z direction) and are electrically connected to the corresponding interlayer connectors 344*a*. The oxide material 350 may be covered by an insulating material layer 353. A plurality of conductive wires 354 can penetrate through the insulating material layer 353 and be electrically connected to the corresponding upper vias 352. The chips A, B, and C can be formed on the multilayer structure 300, and are electrically connected to the multilayer structure 300 by corresponding conductive wires 354 and upper vias 352.

The multilayer structure of the present invention can be applied to a system in package (SIP), for example, to 2.1D IC, 2.5D IC, and 3D IC. In the present embodiment, the multilayer structure 300 can be function as a SI Interposer.

In some embodiments, substrate 301 can be a silicon substrate or other suitable substrate. The substrate via 301V may be a through-silicon via (TSV). The conductive wires 354 can be a redistribution layer that has the function of combining different wafers in a system-in-package. The substrate via 301V can be a selective component and can be electrically connected to other chips and substrates.

In some embodiments, the chips A, B, and C can be the same chips, for example, all of which are logic devices (eg, central processing unit (CPU)).

In some embodiments, the multi-layer structure 300 can provide heterogeneous integration, and the chips A, B, and C can be different chips, for example, the chip A is a central processing unit, and the chip B is a Non-Volatile Memory (NVM), and the chip C is a Dynamic Random Access Memory (DRAM).

According to an embodiment of the present invention, a multilayer structure and method for fabricating the same are provided. The multilayer structure includes a substrate and a plurality of sub-stacks. The sub-stacks respectively extend along a first direction (eg, X-direction) and are disposed along a second direction (eg, Y-direction) on an upper surface of the substrate. Each of the sub-stacks includes a plurality of insulating layers and a plurality of patterned sacrificial layers alternately stacked on the upper surface of the substrate along a third direction (eg, Z direction), includes a plurality of conductive layers alternatively stacked with the insulating layers along a third direction (eg, Z direction) on the upper surface of the substrate, and includes a plurality of interlayer connectors 344a extending along a third direction (eg, Z direction). The patterned sacrificial layers have first sides and second sides opposite to the first sides. The conductive layers include a plurality of first side conductive layers corresponding to the first sides and a plurality of second side conductive layers corresponding to the second sides. The plurality of interlayer connectors are electrically connected and directly in contact with corresponding ones of the conductive layers.

In the multilayer structure of the present invention, the interlayer connector are in direct contact with corresponding ones of the conductive layers, and the contact regions between the interlayer connectors and the corresponding ones of the conductive layers do not have other layers (for example, a barrier layer). In comparison with a comparative example in which a plurality of deposition processes are required to form barrier layers, conductive layers, and interlayer connectors, since a plurality of conductive layers and a plurality of interlayer connectors can be formed by the same conductor process, the process method of the present invention can decrease the complexity of the process, lower the amount of conductive material and reduce the costs.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A multilayer structure, comprising:
a substrate; and
a plurality of sub-stacks extending along a first direction respectively, and disposed on an upper surface of the substrate along a second direction;
each of the sub-stacks comprising:
a plurality of insulating layers and a plurality of patterned sacrificial layers alternately stacked on the upper surface along a third direction;
a plurality of conductive layers alternately stacked on the upper surface with the insulating layers along the third direction; and
a plurality of interlayer connectors extending along the third direction;
wherein the patterned sacrificial layers have a plurality of first sides and a plurality of second sides opposite to the first sides, the conductive layers comprise a plurality of first side conductive layers corresponding to the first sides and a plurality of second side conductive layers corresponding to the second sides;
wherein the interlayer connectors are electrically connected and directly contact corresponding ones of the conductive layers, and the first direction, the second direction, and the third direction are crossed.

2. The multilayer structure according to claim 1, wherein a plurality of contact regions between the interlayer connectors and the corresponding ones of the conductive layers do not have a barrier layer.

3. The multilayer structure according to claim 1, wherein the patterned sacrificial layers are disposed between the first side conductive layers and the second side conductive layers.

4. The multi-layer structure according to claim 1, wherein the first side conductive layers have a first length in the first direction, and the second side conductive layers have a second length in the first direction, and the first length is equal to the second length.

5. The multi-layer structure according to claim 1, wherein portions of the interlayer connectors are floating.

6. The multi-layer structure according to claim 1, further comprising an oxide material covering the sub-stacks, wherein a plurality of upper vias penetrate through the oxide material along the third direction and are electrically connected to corresponding ones of the interlayer connectors.

7. The multilayer structure according to claim 1, wherein the multilayer structure is used for electrically connected to at least one chip, and the at least one chip is disposed on the multilayer structure.

8. The multi-layer structure according to claim 1, wherein the first side conductive layers directly contacting the interlayer connectors have a first width in the second direction, and the first side conductive layers which are not in contact with the interlayer connectors have a second width in the second direction, and the first width is larger than the second width.

9. The multi-layer structure according to claim 8, wherein the second side conductive layers directly contacting the interlayer connectors have a third width in the second direction, and the second side conductive layers which are not in contact with the interlayer connectors have a second width in the second direction, and the third width is larger than the fourth width.

10. The multi-layer structure according to claim 9, wherein the first width is equal to the third width, and the second width is equal to the fourth width.

11. A method for fabricating the multilayer structure according to claim 1, comprising:
providing a substrate having an upper surface;
forming a laminated body on the upper surface of the substrate, wherein the laminated body comprises a plurality of insulating layers and a plurality of sacrificial layers alternately stacked on the upper surface;
forming a plurality of vertical openings, the vertical openings penetrating through portions of the insulating layers and the sacrificial layers;
forming a plurality of trenches, the trenches penetrating through the stacked body and exposing a lowermost insulating layer of the insulating layers;
removing portions of the sacrificial layers and forming a plurality of lateral openings at positions where the sacrificial layers are removed, wherein remaining ones of the sacrificial layers form a plurality of patterned sacrificial layers;
filling a conductive material in the vertical openings and the lateral openings to form a plurality of interlayer connectors in the vertical openings, and to form a plurality of conductive layers in the lateral openings, wherein the interlayer connectors, the conductive layers, the patterned sacrificial layers and the insulating layers constitute a plurality of sub-stacks, wherein the sub-stacks respectively extend along a first direction and are disposed along the second direction on the upper surface of the substrate, the interlayer connectors extend along a third direction, wherein the first direction, the second direction, and the third direction are crossed;
wherein the patterned sacrificial layers have a plurality of first sides and a plurality of second sides opposite to the first sides, the conductive layers including a plurality of first side conductive layers corresponding to the first sides and a plurality of second side conductive layers corresponding to the second sides;
wherein the interlayer connectors are electrically connected and directly contact corresponding ones of the conductive layers.

12. The method according to claim 11, wherein a plurality of contact regions between the interlayer connectors and the corresponding ones of the conductive layers do not have a barrier layer.

13. The method according to claim 11, wherein the step of forming the patterned sacrificial layers further comprises:
removing the portions of the sacrificial layers from the vertical openings and the lateral openings by an etching process.

14. The method according to claim 11, wherein the first side conductive layers have a first length in the first direction, and the second side conductive layers have a second length in the first direction, and the first length is equal to the second length.

15. The method according to claim 11, wherein portions of the interlayer connectors are floating.

16. The method according to claim 11, further comprising:
forming an oxide material covering the sub-stacks, wherein a plurality of upper vias penetrate through the oxide material along the third direction and are electrically connected to corresponding ones of the interlayer connectors.

17. The method according to claim 11, wherein the multilayer structure is used for electrically connected to at least one chip, and the at least one chip is disposed on the multilayer structure.

18. The method according to claim 11, wherein the first side conductive layers directly contacting the interlayer connectors have a first width in the second direction, and the first side conductive layers which are not in contact with the interlayer connectors have a second width in the second direction, and the first width is larger than the second width.

19. The method according to claim 18, wherein the second side conductive layers directly contacting the interlayer connectors have a third width in the second direction, and the second side conductive layers which are not in contact with the interlayer connectors have a second width in the second direction, and the third width is larger than the fourth width.

20. The method according to claim 19, wherein the first width is equal to the third width, and the second width is equal to the fourth width.

* * * * *